(12) United States Patent
Cho et al.

(10) Patent No.: US 11,692,079 B2
(45) Date of Patent: Jul. 4, 2023

(54) 2-DIMENSIONAL MXENE PARTICLE SURFACE-MODIFIED WITH FUNCTIONAL GROUP CONTAINING SATURATED OR UNSATURATED HYDROCARBON, PREPARATION METHOD THEREOF AND USE THEREOF

(71) Applicant: KOREA INSTITUTE OF SCIENCE AND TECHNOLOGY, Seoul (KR)

(72) Inventors: Sangho Cho, Seoul (KR); Chong Min Koo, Seoul (KR); Soon Man Hong, Seoul (KR); Seung Sang Hwang, Seoul (KR); Kyung Youl Baek, Seoul (KR); Daesin Kim, Seoul (KR); Hye-rim Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 634 days.

(21) Appl. No.: 16/589,143

(22) Filed: Oct. 1, 2019

(65) Prior Publication Data
US 2020/0102444 A1    Apr. 2, 2020

(30) Foreign Application Priority Data

Oct. 2, 2018  (KR) ........................ 10-2018-0117801
Apr. 8, 2019  (KR) ........................ 10-2019-0040846

(51) Int. Cl.
*C08K 9/04* (2006.01)
*C08K 3/14* (2006.01)
(Continued)

(52) U.S. Cl.
CPC ............... *C08K 9/04* (2013.01); *C08K 3/14* (2013.01); *C08K 9/06* (2013.01); *C09C 1/3692* (2013.01); *C09C 3/006* (2013.01); *C09C 3/08* (2013.01); *C09C 3/10* (2013.01); *C09D 11/03* (2013.01); *C09D 11/033* (2013.01); *C09D 11/52* (2013.01); *H05K 9/0081* (2013.01); *C01P 2002/82* (2013.01); *C01P 2002/86* (2013.01); *C01P 2004/03* (2013.01); *C08K 2201/001* (2013.01)

(58) Field of Classification Search
None
See application file for complete search history.

(56) References Cited

U.S. PATENT DOCUMENTS

| 2008/0182072 | A1* | 7/2008 | Choi | B82Y 40/00 428/156 |
|---|---|---|---|---|
| 2017/0294546 | A1* | 10/2017 | Ghidiu | C04B 35/58 |
| 2019/0166733 | A1* | 5/2019 | Gogotsi | H01B 1/20 |

FOREIGN PATENT DOCUMENTS

| CN | 108557822 A | 9/2018 |
|---|---|---|
| WO | WO 2017/184957 | * 10/2017 |
| WO | 2019146921 A1 | 8/2019 |

OTHER PUBLICATIONS

Olha Mashtalir et al., "Amine-Assisted Delamination of Nb2 C MXene for Li-Ion Energy Storage Devices," Advanced Materials, 2015, 6 pages.

(Continued)

*Primary Examiner* — Ronak C Patel
(74) *Attorney, Agent, or Firm* — Cantor Colburn LLP

(57) ABSTRACT

The present invention relates to a 2-dimensional MXene particle surface-modified with a functional group comprising a saturated or unsaturated hydrocarbon, a preparation method thereof, and a use thereof (e.g., a conductive film).

4 Claims, 21 Drawing Sheets

(51) Int. Cl.
  *C09D 11/03* (2014.01)
  *C09D 11/033* (2014.01)
  *C09D 11/52* (2014.01)
  *C08K 9/06* (2006.01)
  *C09C 3/00* (2006.01)
  *C09C 3/08* (2006.01)
  *C09C 3/10* (2006.01)
  *C09C 1/36* (2006.01)
  *H05K 9/00* (2006.01)

(56) References Cited

OTHER PUBLICATIONS

Japanese Office Action for JP Application No. 2019-170028 dated Sep. 15, 2020, citing the above reference(s).

Kathleen Maleski et al., "Dispersions of Two-Dimensional Titanium Carbide MXene in Organic Solvents," Chemistry of Materials, Feb. 17, 2017, pp. 1632-1640, vol. 29, No. 4, American Chemical Society.

M. Auernhammer et al., "Surface functionalization of 6H—SiC using organophosphonate monolayers," Applied Physics Letters, Mar. 5, 2012, pp. 101601-1-101601-4, vol. 100, No. 10.

Renji Bian et al., "3D assembly of Ti3C2-MXene directed by water/oil interfaces," Nanoscale, 2018, pp. 3621-3625, vol. 10, No. 8, The Royal Society of Chemistry.

Lei Shen et al., "Carbon-intercalated Ti3C2Tx MXene for high-performance electrochemical energy storage," Journal of Materials Chemistry A, 2018, pp. 23513-23520, vol. 6.

Korean Office Action for KR Application No. 10-2019-0040846 dated Jun. 17, 2020, citing the above reference(s). In conformance with MPEP 609—Concise explanation of the relevance includes issue date of KR OA and references cited therein.

Celine Schmitt Pauly, et al., Simultaneous Phase Transfer and Surface Modification of TiO2 Nanoparticles Using Alkylphosphonic Acids: Optimization and Structure of the Organosols, Langmuir, 31, 40, 10966-10974 (2015).

Ke Chen, et al., Strong and biocompatible poly(lactic acid) membrane enhanced by Ti3C2Tz (MXene) nanosheets for Guided bone regeneration, Materials Letters, 229, 114-117 (2018).

Office Action issued in corresponding Chinese Patent Application Serial No. 201910951042.6, dated Jul. 28, 2022, 10 pp.

\* cited by examiner

R : Hexyl, Dodecyl, Oleyl, Benzyl, Polystyrene etc.

MXene-NH₂PS ink in Toluene

MXene Aqueous solution    MXene Organic solvent    MXene Aqueous solution    MXene Organic solvent Before dispersion            After 3 months Hexanol Stable for 1 month

2-DIMENSIONAL MXENE PARTICLE SURFACE-MODIFIED WITH FUNCTIONAL GROUP CONTAINING SATURATED OR UNSATURATED HYDROCARBON, PREPARATION METHOD THEREOF AND USE THEREOF

TECHNICAL FIELD

The present invention relates to a 2-dimensional MXene particle surface-modified with a functional group containing a saturated or unsaturated hydrocarbon, a preparation method thereof, and a use thereof (e.g., a conductive film).

BACKGROUND ART

As a phenomenon caused by electromagnetic waves generated in electronic, communication, transportation, aviation, and military equipment, electromagnetic interference (EMI) is not only a cause of malfunction of devices, but can also have harmful effects on humans. In particular, as electronic devices have recently become smaller, more highly integrated, and more sophisticated, problems of malfunction due to the phenomenon of electromagnetic wave interference between devices have become more serious. As electromagnetic shielding materials prevent the phenomenon of electromagnetic interference, the higher electric conductivity of the material leads to excellent electromagnetic wave-shielding efficiency. In the past, metal materials such as silver and copper were mainly used. However, since these materials have drawbacks of high density, high manufacturing cost, heaviness, susceptibility to corrosion, and difficulty in processing, there are limitations to their use for next generation mobile electronic/communication devices.

In order to overcome the problems of these existing materials, there has been growing interest in developing a material having an excellent electromagnetic wave-shielding ability with a multilayer laminated structure which is similar to that of graphite, using polymer composites containing transition metal carbides and transition carbonitrides called MXenes, a new nanomaterial having a 2-dimensional structure.

As a representative 2-dimensional nanoparticle, graphene has excellent mechanical and electromagnetic properties, and is thereby actively being studied as a next-generation material. Among these 2-dimensional nanoparticles, the recently developed MXenes have a layered structure of transition metals and carbons.

In 2011, a new line of 2-dimensional crystalline transition metal carbides called MXenes was developed at Drexel University. In 2015, the MXene family was further expanded by the discovery of double-transition metal (double-M) MXenes. Recently, 20 different MXene compositions such as $Ti_2C$, $Ti_3C_2$, $Nb_2C$, $V_2C$, $Ta_4C_3$, $Mo_2TiC_2$, $Mo_2Ti_2C_3$, and $Cr_2TiC_2$ have been synthesized, and most MXenes have very high metallic conductivity.

In general, MXenes are synthesized from a ceramic material called a MAX phase. The MAX phase has a laminated structure of transition metals, carbons, and Group 14 elements (aluminum or silicon, etc.), and through an etching process using a strong acid such as hydrofluoric acid, only the Group 14 elements are selectively removed, leaving 2-dimensional MXene nanoparticles. Through a reaction in the strong acid aqueous solution, terminal groups such as —OH, =O, —F, etc. are formed on the surface of the MXenes, and these functional groups provide hydrophilic properties. Accordingly, these synthesized MXenes have an excellent water-dispersion property and thus can be used as a functional material through various processes by being prepared as a water dispersion ink. Additionally, 2-dimensional MXenes with excellent electrical conductivity can be provided functionality through adjustment of the composition type and ratio of transition metals and carbon/nitrogen constituting them.

However, since MXenes dispersed in an aqueous phase can easily be oxidized by water molecules and dissolved oxygen, thereby becoming metal oxides and losing their inherent excellent properties, long-term storage is difficult. MXenes dispersed in an aqueous phase are difficult to re-disperse once aggregated. In addition, MXenes having a hydrophilic surface cannot easily form a homogeneous composite material since they have a low attractive force with materials having hydrophobicity (polymers, organic solvents, etc.). Furthermore, there is a limitation in the preparation of a mixed ink with a hydrophobic material as an aqueous dispersion ink, and the high boiling point of water and high energy consumption for water removal present limitations in liquid phase processes such as spray coating, spin coating, inkjet printing, etc.

SUMMARY

Technical Problem

Particles which are easily dispersed in an organic solvent not only make it easy to prepare a polymer composite containing the same, but also have advantageous features in application of films and coating products having varying performance.

Accordingly, the present invention is to improve the problems of a hydrophilic MXene particle by modifying the surface of a 2-dimensional MXene particle to have hydrophobicity or with a ligand having a functional group, thereby reducing the hydrophilic feature or providing a hydrophobic feature, and therefore a method is provided for preparing ink in which the surface-modified 2-dimensional MXene particle is dissolved in an organic solvent.

Technical Solution

A first aspect of the present invention is to provide a passivated 2-dimensional MXene particle, comprising: a 2-dimensional MXene particle surface-modified with a functional group comprising a saturated or unsaturated hydrocarbon; and an organic protective film formed on the surface of the surface-modified 2-dimensional MXene particle.

A second aspect of the present invention is to provide a method for preparing a 2-dimensional MXene particle surface-modified with a functional group comprising a saturated or unsaturated hydrocarbon, comprising:

a first step of preparing an aqueous solution in which a MXene particle prepared through an acid etching process is dispersed;

a second step of preparing an organic solution in which a functional group comprising a saturated or unsaturated hydrocarbon is dissolved in an organic solvent which is phase-separated with the aqueous solution; and a third step of mixing and stirring the aqueous solution containing the MXene particle of the first step and the organic solution of the second step to surface-modify the MXene particle with a functional group comprising a saturated or unsaturated hydrocarbon through an interfacial reaction.

A third aspect of the present invention is to provide a method of preparing a MXene organic solvent-dispersed ink, comprising:

a first step of preparing an aqueous solution in which a MXene particle prepared through an acid etching process is dispersed;

a second step of preparing an organic solution in which a functional group comprising a saturated or unsaturated hydrocarbon is dissolved in an organic solvent which is phase-separated with the aqueous solution;

a third step of mixing and stirring the aqueous solution containing the MXene particle of the first step and the organic solution of the second step to surface-modify the MXene particle with a functional group comprising a saturated or unsaturated hydrocarbon through an interfacial reaction;

a fourth step of inducing phase separation after the interfacial reaction;

a fifth step of separating the organic solution containing the surface-modified MXene particle in the phase-separated aqueous solution layer; and a sixth step of selectively adjusting the concentration of the organic solution obtained in the fifth step or replacing the solvent.

A fourth aspect of the present invention is to provide an organic solvent-dispersed ink containing a 2-dimensional MXene particle surface-modified with a functional group comprising a saturated or unsaturated hydrocarbon.

A fifth aspect of the present invention is to provide a film or a composite which is prepared by a liquid phase process using the organic solvent-dispersed ink of the fourth aspect.

A sixth aspect of the present invention is to provide a composite containing the 2-dimensional MXene particle surface-modified with the functional group comprising the saturated or unsaturated hydrocarbon according to the first aspect or a surface-modified 2-dimensional MXene particle in which an organic film thereof is removed; and a polymer, a heterogeneous particle other than the surface-modified 2-dimensional MXene particle, or both.

Hereinafter, the present invention is described in more detail.

The present invention is characterized in that a 2-dimensional MXene particle, e.g., a hydrophilic MXene particle represented by $M_{n+1}X_n(T_x)$ or $M'_2M''_nX_{n+1}(T_x)$, is surface-modified with a functional group comprising a saturated or unsaturated hydrocarbon.

In the present invention, a MXene may be a 2-dimensional transitional metal carbide, nitride, or combination thereof comprising at least one layer wherein a crystal cell represented by Empirical Formula 1 below is substantially formed in a 2-dimensional array (see FIG. 1).

$$M_{n+1}X_n \quad \text{[Empirical Formula 1]}$$

wherein, each X is located within an octahedral array,

M is a metal selected from the group consisting of Group IIIB metals, Group IVB metals, Group VB metals, and Group VIB metals, each X is C, N, or a combination thereof, preferably C, and n is 1, 2, or 3.

Non-limiting examples of M are Sc, Y, Lu, Ti, Zr, Hf, V, Nb, Ta, Cr, Mo, W, and combination thereof, in particular, non-liming examples of an $M_{n+1}X_n$ MXene are $Sc_2C$, $Ti_2C$, $V_2C$, $Cr_2C$, $Cr_2N$, $Zr_2C$, $Nb_2C$, $Hf_2C$, $Ti_3C_2$, $Ti_2C$, $V_3C_2$, $Ta_3C_2$, $Ta_4C_3$, $Ti_4C_3$, $V_4C_3$, $Ta_4C_3$, or a combination thereof.

In addition, in the present invention, a MXene may be a 2-dimensional transitional metal carbide, nitride, or combination thereof comprising at least one layer wherein a crystal cell represented by Empirical Formula 2 below is substantially formed in a 2-dimensional array.

$$M'_2M''_nX_{n+1} \quad \text{[Empirical formula 2]}$$

wherein, each X is located within an octahedral array of M' and M",

M' and M" are different metals selected from the group consisting of Group IIIB metals, Group IVB metals, Group VB metals, and Group VIB metals (e.g., Ti, V, Nb, Ta, Cr, Mo, or a combination thereof), each X is C, N, or a combination thereof, preferably C, and n is 1 or 2.

Non-limiting examples of $M'_2M''_nX_{n+1}$ are $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, $V_2Ti_2C_3$, etc.

In general, as shown in FIG. 1, a MXene can be synthesized by etching a MAX phase.

Non-limiting examples of an etching agent for etching a MAX phase to produce a MXene include strong etching agents, etc. comprising $F^-$ such as HF, $NH_4HF_2$, and a mixture of HCl and LiF. For example, etching $Ti_3AlC_2$ in a HF aqueous solution at room temperature selectively removes Al atoms and forms O, OH, and/or F atoms as a terminal group in carbide layers.

Accordingly, a MXene prepared through etching in the present invention can be represented by $M_{n+1}X_n(T_x)$ or $M'_2M''_nX_{n+1}(T_x)$, wherein $T_x$ refers to a terminal group such as —OH, =O, —F, etc. formed through etching.

In the present specification, the saturated or unsaturated hydrocarbon includes an aliphatic hydrocarbon, an alicyclic hydrocarbon, and an aromatic hydrocarbon such as $C_nH_{2n+1}$, $C_nH_{2n-1}$, and $C_nH_{2n-3}$ ($1 \leq n \leq 25$), and further includes a hydrocarbon which is substituted with a functional group (e.g., —OH, —NH$_2$, —COOH, and —CH=CH—).

In the present invention, the functional group comprising the saturated or unsaturated hydrocarbon may include a functional group capable of forming an ionic or a covalent bond between a MXene surface and a surface-modifying precursor comprising the saturated or unsaturated hydrocarbon dispersed in an organic phase.

Specifically, the functional group may be selected from the group consisting of phosphonate, amine, and silane, but is not limited thereto as long as it corresponds to a functional group capable of surface-modifying a MXene. However, since it was confirmed in the present invention that surface-modifying by binding a carboxylate to the surface of a MXene was not possible, the functional group comprising the saturated or unsaturated hydrocarbon of the present invention is significant in that it was substantially confirmed that the functional group is capable of surface-modifying a MXene.

Meanwhile, among the functional groups, the phosphonate is represented by Formula 1 or 2 below, the amine by Formula 3 below, and the silane by Formula 4 below:

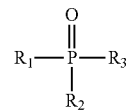

[Formula 1]

[Formula 2]

[Formula 3]
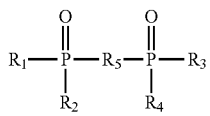

[Formula 4]
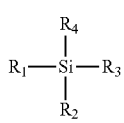

wherein, $R_1$, $R_2$, $R_3$, and $R_4$ are independently a saturated or unsaturated hydrocarbon, a $C_1$ to $C_6$ alkoxy, or a hydroxyl group, and $R_5$ is a saturated or unsaturated hydrocarbon, except in a case where $R_1$, $R_2$, $R_3$, and $R_4$ are all a saturated or unsaturated hydrocarbon and a case where $R_1$, $R_2$, $R_3$, and $R_4$ are all a hydroxyl group, and $A_1$, $A_2$, and $A_3$ are independently H or a saturated or unsaturated hydrocarbon, except in a case where $A_1$, $A_2$, and $A_3$ are all H.

In the present invention, the saturated or unsaturated hydrocarbon may be a saturated or unsaturated hydrocarbon which is independently selected from the group consisting of $C_{1-25}$ alkyl, $C_{2-25}$ alkenyl, $C_{2-25}$ alkynyl, $C_{6-25}$ aryl, or ($C_{6-25}$ aryl)-($C_{1-4}$ alkyl), and specifically, may be $C_{1-13}$ alkyl, $C_{2-13}$ alkenyl, $C_{2-13}$ alkynyl, $C_{6-10}$ aryl, or ($C_{6-10}$ aryl)-($C_{1-4}$ alkyl), but is not limited thereto. Furthermore, the saturated or unsaturated hydrocarbon may include a heteroatom such as O, N, or S, etc., in the middle or on the side of the chain. In addition, the saturated or unsaturated hydrocarbon may be substituted with a functional group such as hydroxyl group, carboxyl group, etc. and may be a hydrophobic polymer of a repeating unit of 1,000 or less or an average molecular weight of 500,000 or less.

In a specific embodiment of the present invention, a polymer comprising a saturated or unsaturated hydrocarbon of $C_{25}$ or less or a saturated or unsaturated hydrocarbon of molecular weight of 5,000 or less was used, but the number of carbon atoms constituting the hydrocarbon group is not limited thereto, as long as the saturated or unsaturated hydrocarbon can be dispersed in an organic solvent by comprising a hydrophobic residue.

In the present invention, examples of an amine comprising a saturated or unsaturated hydrocarbon available in surface modification of a MXene particle are as follows:

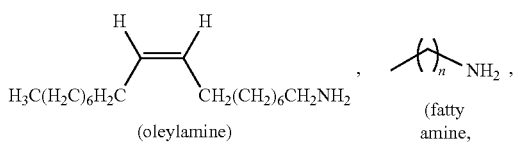

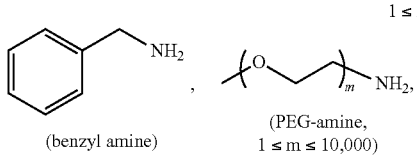

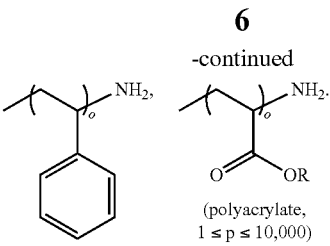

Specifically, the amine comprising a saturated or unsaturated hydrocarbon may be hexylamine, dodecylamine and an aminated hydrophobic polymer (polystyrene comprising —$NH_2$ at the end, MW=5,000), but not limited thereto.

In the present invention, examples of a phosphonate comprising a saturated or unsaturated hydrocarbon available in surface modification of a MXene particle are as follows:

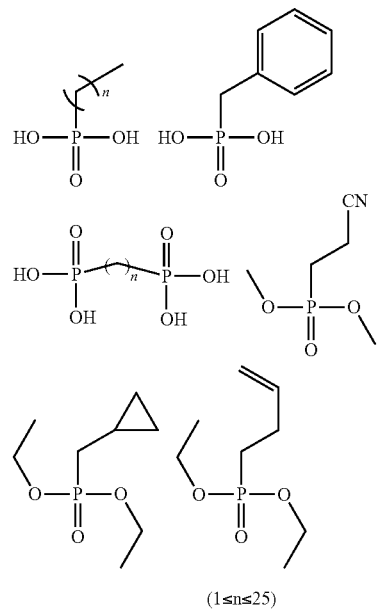

Specifically, the phosphonate comprising a saturated or unsaturated hydrocarbon may be propyl phosphonic acid, hexyl phosphonic acid, octyl phosphonic acid, decyl phosphonic acid, dodecyl phosphonic acid, tert-butyl phosphonic acid, phenyl phosphonic acid and benzyl phosphonic acid, diethyl 3-butenyl phosphonate and diethyl (2-cyanoethyl) phosphonate, but not limited thereto.

In the present invention, examples of a silane comprising a saturated or unsaturated hydrocarbon available in surface modification of a MXene particle are as follows:

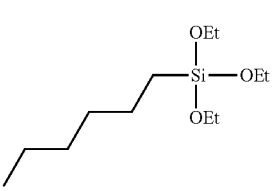

-continued

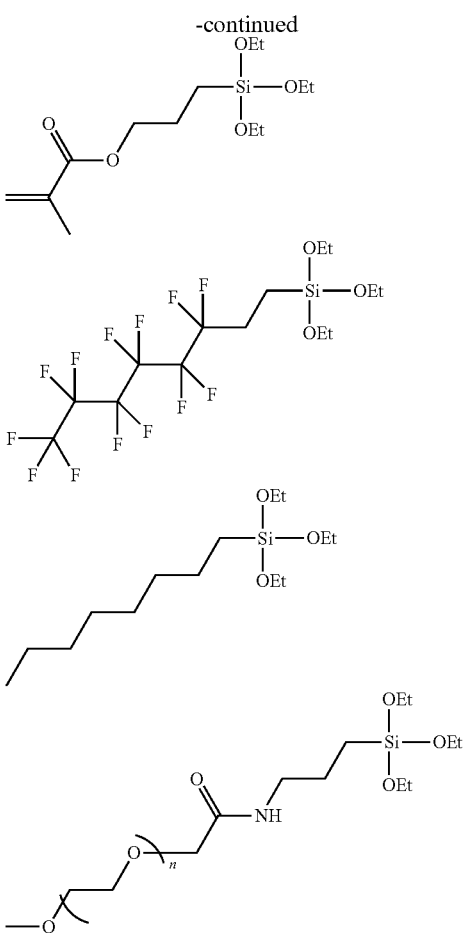

Specifically, the silane comprising a saturated or unsaturated hydrocarbon may be Dodecyltriethoxysilane, but not limited thereto.

According to the present invention, when a 2-dimensional MXene particle, e.g., a hydrophilic MXene particle represented by $M_{n+1}X_n(T_x)$ or $M'_2M''_nX_{n+1}(T_x)$, is surface-modified with a relatively hydrophobic functional group comprising a saturated or unsaturated hydrocarbon, the 2-dimensional MXene particle can be easily dispersed in an organic solvent and evenly mixed with an organic polymer dispersed in an organic solvent.

Accordingly, an organic protective film can be formed on the surface of a 2-dimensional MXene particle surface-modified with a functional group comprising a saturated or unsaturated hydrocarbon by an organic solvent or an organic polymer, and due to this, its contact with oxygen or water is inhibited such that the oxidation of the 2-dimensional MXene particle is inhibited, i.e., the 2-dimensional MXene particle can be passivated. That is, it is possible to prevent oxidation by limiting contact with water, which is very advantageous for long-term storage. In addition, the present invention can be applied regardless of the size of a 2-dimensional MXene particle and can also be applied to a case where nanoparticles have problems of dispersion and aggregation.

Accordingly, the present invention can provide a passivated 2-dimensional MXene particle, comprising: a 2-dimensional MXene particle surface-modified with a functional group comprising a saturated or unsaturated hydrocarbon; and an organic protective film formed on the surface of the surface-modified 2-dimensional MXene particle.

In particular, the passivated 2-dimensional MXene particle according to the present invention may be a 2-dimensional MXene particle surface-modified with a functional group comprising a saturated or unsaturated hydrocarbon that is dispersed in an organic solvent forming a protective film and/or covered with an organic polymer forming a protective film or dispersed in an organic polymer.

An organic solvent is widely used in the production of various organic compounds or a composite thereof and in the preparation of a molded product such as a film, and is in a liquid state at room temperature due to its small molecular weight. There are various organic solvents such as alkanes, olefins, alcohols, aldehydes, amines, esters, ethers, ketones, aromatic hydrocarbons, hydrogenated hydrocarbons, terpene olefins, halogenated hydrocarbons, heterocyclic compounds, nitrogen-containing compounds, sulfur-containing compounds, etc.

An organic solvent has intrinsic solubility parameters (constants), and the more similar they are to the solubility parameter of a material to be dispersed/dissolved in the organic solvent, the better their solubility becomes.

Accordingly, by adjusting the molecular weight, composition, and/or substituents of a functional group comprising a saturated or unsaturated hydrocarbon depending on the polarity of an organic solvent to be dispersed, a 2-dimensional MXene particle surface-modified with a functional group can be dispersed/dissolved in various organic solvents as well as in an organic solvent in which various other materials are dispersed/dissolved. In addition, not only can the amount of surface charge of a MXene particle be adjusted to a desired range by adjusting the molecular weight, composition, and/or substituents of the saturated or unsaturated hydrocarbon, but also the polarity of an organic solvent to be dispersed can be adjusted, and through this, an attraction characteristic with a heterogeneous particles or a polymer is adjusted, thereby facilitating the preparation of complex inks and composites.

According to the present invention, the method for preparing a 2-dimensional MXene particle surface-modified with a functional group comprising a saturated or unsaturated hydrocarbon comprises:

a first step of preparing an aqueous solution in which a MXene (nano)particle prepared through an acid etching process is dispersed;

a second step of preparing an organic solution in which a functional group comprising a saturated or unsaturated hydrocarbon is dissolved in an organic solvent which is phase-separated with the aqueous solution; and a third step of mixing and stirring the aqueous solution containing the MXene particle of the first step and the organic solution of the second step to surface-modify the MXene particle with a functional group comprising a saturated or unsaturated hydrocarbon through an interfacial reaction.

In addition, according to the present invention, the method of preparing a MXene organic solvent-dispersed ink comprises:

a first step of preparing an aqueous solution in which a MXene particle prepared through an acid etching process is dispersed;

a second step of preparing an organic solution in which a functional group comprising a saturated or unsaturated hydrocarbon is dissolved in an organic solvent which is phase-separated with the aqueous solution;

a third step of mixing and stirring the aqueous solution containing the MXene particle of the first step and the organic solution of the second step to surface-modify the MXene particle with a functional group comprising a saturated or unsaturated hydrocarbon through an interfacial reaction;

a fourth step of inducing phase separation after the interfacial reaction;

a fifth step of separating the organic solution containing the surface-modified MXene particle in the phase-separated aqueous solution layer; and a sixth step of selectively adjusting the concentration of the organic solution obtained in the fifth step or replacing the solvent.

The above functional group comprising the saturated or unsaturated hydrocarbon of the present invention is as follows.

A first step of preparing an aqueous solution in which a MXene particle prepared through the above acid etching process is dispersed and a second step of preparing an organic solution in which a functional group comprising a saturated or unsaturated hydrocarbon is dissolved can be performed in any order or at the same time.

The MXene particle surface-modified with the functional group comprising the saturated or unsaturated hydrocarbon according to the present invention can be achieved by physisorption with an amine. For example, since the surface of the MXene particle has negative polarity, a compound comprising a functional group having positive polarity can be attached to the surface of the MXene particle due to electrostatic attraction, ionic bonding, or hydrogen bonding; accordingly, the surface of the MXene particle is passivated, and due to the saturated or unsaturated hydrocarbon revealed on the surface, the dispersibility in an organic solvent is improved.

In the preparation method thereof, the aqueous solution in the first step in which a MXene particle prepared through an acid etching process is dispersed may be an acidic solution having a pH in the range of 2 to 6, a neutral solution having a pH in the range of 6 to 7, and an alkaline solution having a pH in the range of 7 to 9 by adjusting the acidity thereof. One of ordinary skill in the art can select an intrinsic suitable pH value capable of activating each functional group according to the kind of the functional group to quickly adjust a reaction rate of surface modification.

A surface modification reaction can be facilitated by adjusting the acidity of a solution and activating a functional group as above. Meanwhile, when the pH is too low, the reaction occurs rapidly, but a MXene particle can turn into a metal oxide due to oxidation. When the pH is too high, the reaction is very slow and may be delayed for a long period of time until the reaction is complete. Accordingly, one of ordinary skill in the art can select an appropriate pH according to the kind of amine compound used.

The preparation method of a 2-dimensional MXene particle surface-modified with a functional group comprising a saturated or unsaturated hydrocarbon according to the present invention and the preparation method of a MXene organic solvent-dispersed ink according to the present invention are characterized in using an organic solvent (solubility in water <10% w/w) which is not mixed with water.

As long as the organic solvent used in the second step cannot be mixed with water and can disperse/dissolve a functional group comprising a saturated or unsaturated hydrocarbon, a surface-modifying agent of a MXene particle, the kind is not limited. Non-limiting examples thereof are acetyl acetone, aniline, anisole, benzene, benzonitrile, benzyl alcohol, 1-butanol, iso-butanol, carbon disulfide, carbon tetrachloride, chlorobenzene, chloroform, cyclohexane, cyclohexanol, cyclohexanone, dichloroethane, N,N-dimethylaniline, diethyl ether, ethyl acetate, 1-heptanol, 1-hexanol, dichloromethane, 2-pentanol, 3-pentanol, 2-pentanone, 3-pentanone, toluene, and p-xylene, and these may be used alone or in a combination of two or more kinds as a mixed solvent.

The third step is a step of mixing and stirring the aqueous solution containing the MXene particle of the first step and the organic solution of the second step to surface-modify the MXene particle with the functional group comprising the saturated or unsaturated hydrocarbon through an interfacial reaction.

As FIG. 2a is a specific embodiment which schematizes the method of preparing a MXene ink dispersed in an organic solvent with 2-dimensional MXene particles surface-modified with a phosphonate through an interfacial reaction, chloroform, which has a higher density than water, is used as an organic solvent, and is thereby located at the bottom. In contrast, when an organic solvent having a density lower than water is used, the aqueous solution is located at the bottom and the organic solution is located at the top, as shown in FIG. 3a.

FIG. 2b schematizes as a specific embodiment the method of preparing a MXene ink dispersed in an organic solvent with 2-dimensional MXene particles surface-modified with an amine through an interfacial reaction. Toluene, which has a lower density than water, is used, and is thereby located at the top. In contrast, when an organic solvent having a density higher than that of water is used, the aqueous solution is located at the top and the organic solvent is located at the bottom, as shown in FIG. 3b.

As illustrated in FIGS. 2a and 2b, when the water-soluble MXene particles in the aqueous solution are surface-modified with amines containing a saturated or unsaturated hydrocarbon at the interface, they become relatively hydrophobic and move to the organic solution. Accordingly, only the surface-modified MXene particles can be easily separated from the organic solution phase. In particular, the surface-modified 2-dimensional MXene particles according to the present invention are prevented from making contact with oxygen or water by the organic solvent in the organic solution, thereby inhibiting the oxidation of the 2-dimensional MXene particles; that is, a protective film which can passivate the 2-dimensional MXene particles can be formed.

In particular, the interface wherein an interfacial reaction occurs between the aqueous solution and the organic solution can be maximized through stirring and a stirring rate can be appropriately selected by one of ordinary skill in the art according to the conditions such as the volume of solution and the presence of an agitator and a magnetic bar. As long as an interfacial reaction can be induced, it is possible to simply shake and stir by hand.

The third step can be performed at 5° C. to 100° C. for 1 second to 24 hours.

As the fourth step induces phase separation after the interfacial reaction, for example, when stirring is stopped and the mixture is allowed to stand, the aqueous solution and the organic solution can be separated.

As the fifth step separates the organic solution containing the surface-modified MXene particles in the phase-separated aqueous solution layer, through this, the surface-modified MXene particles dispersed in the organic solution can be recovered. In a specific embodiment of the present invention, a MXene was surface-modified with the preparation method of the present invention using various organic solvents and phase-separated to remove the aqueous solution, followed by recovery of the MXene particles surface-modified in a form dispersed in an organic solution (FIGS. 4a and 4b).

In particular, an unreacted functional group can form an emulsion as a micelle structure, and accordingly, a step of removing the unreacted functional group by applying ultrasonic waves may further be included, and by removing the same, the separation of an organic solution can be facilitated.

The preparation method of a MXene organic solvent-dispersed ink according to the present invention may or may not further include performing the sixth step of adjusting the concentration of the organic solution obtained in the fifth step or replacing the solvent.

The concentration of the organic solution containing the surface-modified MXene in the sixth step may be adjusted by condensation thereof through natural evaporation, rotary vacuum evaporation, centrifugation, etc., or dilution thereof through the addition of a solvent.

The replacement of the solvent in the sixth step may be performed through a centrifuge, a method of sequential condensation and dilution, and a dialysis method.

Through the sixth step, the concentration of a MXene organic solvent-dispersed ink may be adjusted from 0.1 mg/mL to 100 mg/mL.

As can be seen in FIGS. 7a and 7b (selected area electron diffraction) and FIGS. 10a and 10b, the 2-dimensional MXene particle surface-modified with the functional group comprising the saturated or unsaturated hydrocarbon according to the present invention, and specifically, the 2-dimensional MXene particle surface-modified with a phosphonate comprising the saturated or unsaturated hydrocarbon (FIG. 7a) and the 2-dimensional MXene particle surface-modified with an amine comprising the saturated or unsaturated hydrocarbon (FIG. 7b) also maintain the crystal structure of the 2-dimensional MXene particle before surface modification, and thus can maintain its inherent properties (e.g., electrical conductivity).

For example, the 2-dimensional MXene particle surface-modified with the functional group comprising the saturated or unsaturated hydrocarbon according to the present invention can retain the properties of excellent electrical conductivity, magnetic loss, and dielectric loss, which are the inherent properties of the 2-dimensional MXene particle itself before surface modification, and can thereby be used as an electromagnetic wave absorbent.

In the present invention, 2-dimensional MXene particles to be surface-modified may be free-standing 2-dimensional assemblies having the same crystal structure continuously, or stacked assemblies. For the stacked assemblies, atoms and ion molecules may be intercalated between layers. In particular, the intercalated atom or ion may be lithium. Accordingly, the 2-dimensional MXene particle surfaced-modified with the functional group comprising the saturated or unsaturated particle according to the present invention may also be used in energy storage devices such as a battery and a super capacitor.

Furthermore, for the 2-dimensional MXene particle surface-modified with the functional group comprising the saturated or unsaturated hydrocarbon according to the present invention, the amount of surface charge of the MXene particle may be adjusted by adjusting the molecular weight, composition, and/or substituent of the functional group comprising the saturated or unsaturated hydrocarbon, and the polarity of a solvent to be dispersed may be diversified, and a functional group for a subsequent reaction may be introduced. Further, the organic-dispersed ink comprising the 2-dimensional MXene particle surface-modified with the functional group comprising the saturated or unsaturated hydrocarbon according to the present invention may form a film and a composite through a liquid phase process (a filtration method, a spraying process, spin coating, dip coating, inkjet, multilayer coating, etc.).

For example, the 2-dimensional MXene particle surface-modified with the functional group comprising the saturated or unsaturated hydrocarbon according to the present invention can produce a thin film formed in a uniform thickness on a substrate by uniformly applying an ink dispersed in an organic solvent on a substrate and evaporating the solvent.

Accordingly, the present invention can provide an organic solvent-dispersed ink containing the 2-dimensional MXene particle surface-modified with the functional group comprising the saturated or unsaturated hydrocarbon as well as an organic solvent-dispersed ink containing a particle other than the surface-modified 2-dimensional MXene particle and/or a polymer.

The above ink may be a photoresist.

Non-limiting examples of other particle include metals (e.g., Ag, Au, Cu, Pd, and Pt), metal oxides (e.g., $SiO_2$ and ITO), nitrides, carbides, semiconductors (e.g., Si, GaAs, and InP), glasses (e.g., silica or boron-based glasses), liquid crystals (e.g., poly(3,4-ethylenedioxythiophene)), organic and inorganic porous materials, organic polymers, etc.

Non-limiting examples of the above polymer are polypropylene, polyethylene, polyetherimide, polyetherketone, polyetheretherketone, polyamide, polycarbonate, polystyrene, polyurethane, polysiloxane, etc.

The present invention can prepare a functional film comprising a 2-dimensional MXene particle using an organic solvent in a state in which the oxidation of MXene is inhibited through a liquid phase process such as spray coating, spin coating, inkjet printing, a filtration method, etc.

In addition, the 2-dimensional MXene particle surface-modified with the functional group comprising the saturated or unsaturated hydrocarbon may form a homogenous high-performance composite material or a composite due to its high miscibility with a material (polymer, etc.) having hydrophobicity.

Accordingly, the present invention can provide a composite containing a 2-dimensional MXene particle surface-modified with a functional group containing a saturated or unsaturated hydrocarbon (in which an organic film thereof may be removed); and a polymer and/or a heterogeneous particle other than the surface-modified 2-dimensional MXene particle.

Advantageous Effects of the Invention

The 2-dimensional MXene particle surface-modified according to the present invention can be stably dispersed in an organic solvent by introducing hydrophobicity on the surface, and in particular, dispersion in a solvent having a low boiling point facilitates a liquid phase process by utilizing the formed ink. Additionally, the 2-dimensional MXene particle surface-modified with the functional group comprising the saturated or unsaturated hydrocarbon can be provided various functionalities through subsequent processes. Dispersing the 2-dimensional MXene particle surface-modified according the present invention in an organic solvent for storage can remarkably delay the oxidation that occurs when storing in an aqueous dispersion or dried form.

In addition, surface hydrophobicity and a functional group can maximize the kind of composite which utilizes 2-dimensional MXene particles and various heterogeneous nanoparticles or polymers.

BRIEF DESCRIPTION OF DRAWINGS

With regard to the aminated hydrophobic polymer according to Example 2, e.g., MXene particles surfaced-modified with aminated polystyrene.

DETAILED DESCRIPTION OF THE INVENTION

Figure 1:
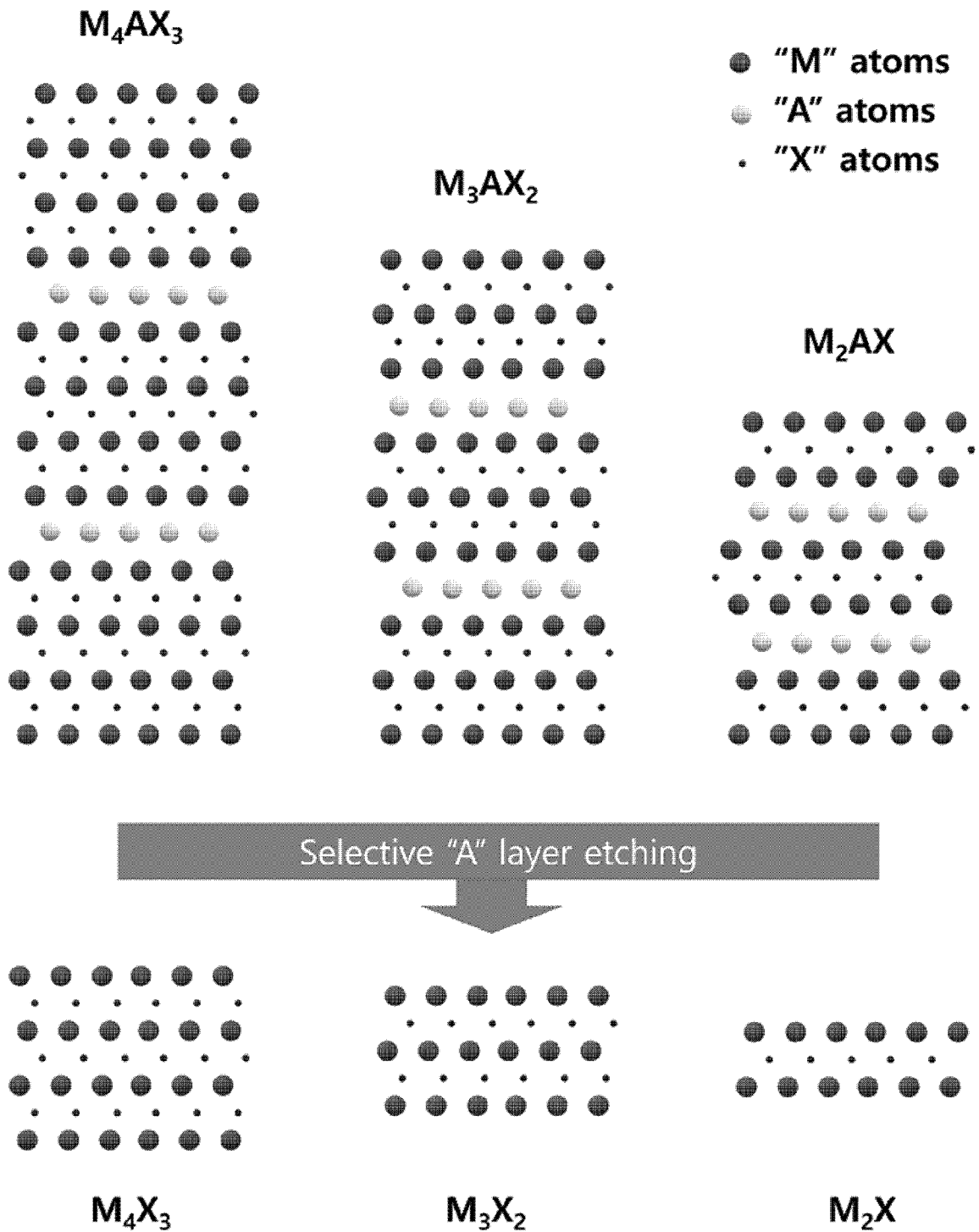
FIG. 1 is a conceptual diagram which shows the synthesis of a MXene by etching a MAX phase according to a specific embodiment.
Figure 2A:
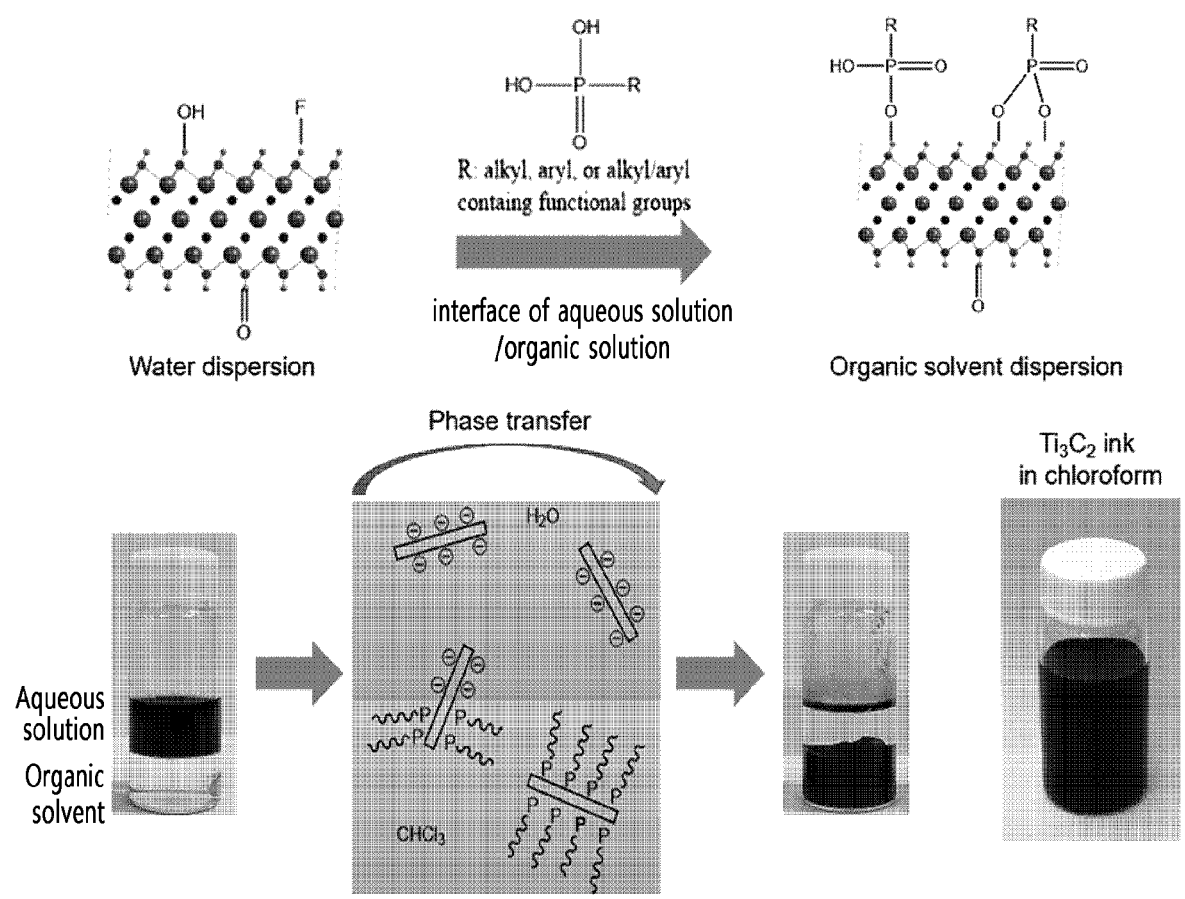
FIG. 2a schematizes the method of preparing a MXene ink in which a 2-dimensional MXene particle surface-modified with phosphonate through an interfacial reaction is dispersed in an organic solvent.
Figure 2B:
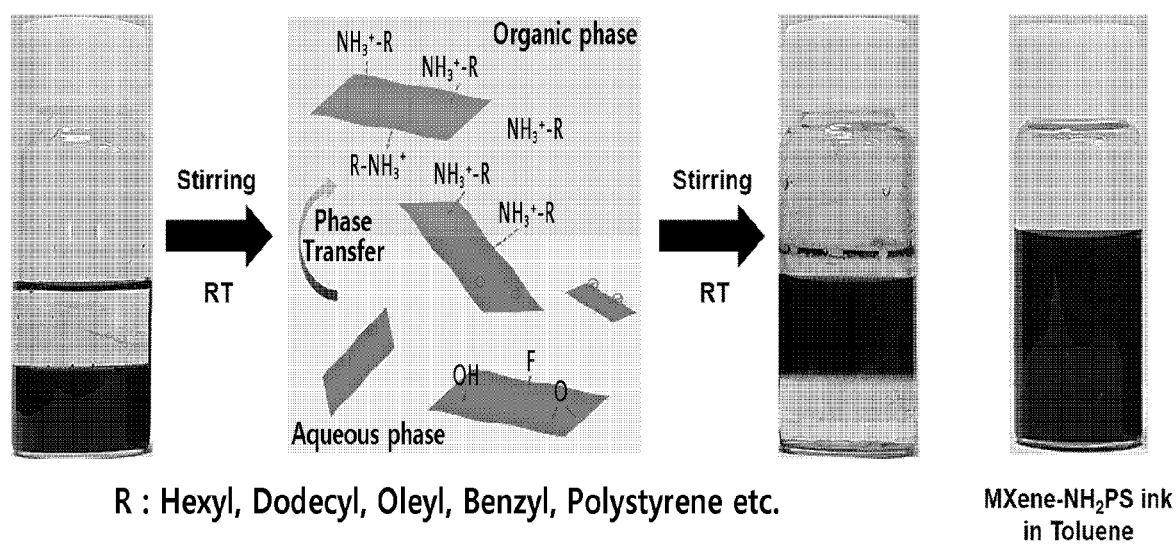
FIG. 2b shows the method of preparing a MXene ink in which a 2-dimensional MXene particle surface-modified with an amine through an interfacial reaction is dispersed in an organic solvent, and the form of ink before and after the reaction and of the final product in which a MXene surface-modified with polystyrene-amine is dispersed in toluene.

Hereinafter, the present invention will be described in detail through exemplary embodiments so as to enable one of ordinary skill in the art to easily practice the present invention. However, these exemplary embodiments are provided for the purpose of illustration only and are not intended to limit the scope of the present invention.

Example 1-1 to Example 1-6: Surface Modification of MXene Using Alkyl Phosphonate A delaminated Ti$_3$C$_2$T$_x$ MXene aqueous solution which was prepared by treating Ti$_3$AlC$_2$ powder (average particle diameter ≤30 μm) with LiF—HCl was diluted to 1 mg/mL to prepare 10 mL, which was followed by adding hydrochloric acid to the aqueous solution to adjust the pH to the range of 2 to 3. 7 mg of each of propyl phosphonic acid, hexyl phosphonic acid, octyl phosphonic acid, decyl phosphonic acid, dodecyl phosphonic acid, and tert-butyl phosphonic acid, which are alkyl phosphonic acids, was dissolved in 10 mL of 1-hexanol, an organic solvent, to prepare each organic solution. The aqueous solution was mixed with each organic solution and stirred at room temperature to perform an interfacial reaction. The stirring was stopped after 6 hours and the mixture was allowed to stand until the aqueous solution and the organic solution had separated, which was followed by separating the organic solution, in which MXene particles surface-modified with alkyl phosphonate were dissolved.

Example 2-1 to Example 2-2: Surface Modification of MXene Using Aryl Phosphonate Except for a case where each of phenyl phosphonic acid and benzyl phosphonic acid, which are aryl phosphonic acids, was used instead of an alkyl phosphonic acid in 1-hexanol, which is an organic solvent, by using the same method as in Example 1 above, an organic solution, in which MXene particles surface-modified with an aryl phosphonate were dissolved, was separated by carrying out an interfacial reaction.

Example 3-1 to Example 3-2: Surface Modification of MXene Using Phosphonate Having Functional Group Except for a case where each of diethyl 3-butenyl phosphonate and diethyl (2-cyanoethyl) phosphonate, which are phosphates having a functional group, was used instead of an alkyl phosphonic acid in 1-hexanol, which is an organic solvent, an organic solution, in which MXene particles surface-modified with a phosphonate having a functional group were dissolved, was separated by carrying out a reaction using the same method as in Example 1 above.

Example 4-1: Surface Modification of MXene Using Alkylamine

A delaminated $Ti_3C_2T_x$ MXene aqueous solution which was prepared by treating $Ti_3AlC_2$ powder (average particle diameter ≤40 μm) with LiF—HCl was diluted to 1 mg/mL to prepare 10 mL. The pH of the above aqueous solution was about 5. Each organic solution was prepared by dissolving 40 mg of an alkylamine such as hexylamine, dodecylamine, etc. in 10 mL of an organic solvent (dichloromethane, chloroform, chlorobenzene, benzene, toluene, and hexane). The above aqueous solution was mixed with each organic solution and stirred at room temperature to perform an interfacial reaction. The stirring was stopped after 24 hours and the mixture was allowed to stand until the aqueous solution and the organic solution had separated, which was followed by separating the organic solution, in which MXene particles surface-modified with an alkylamine were dispersed. In order to facilitate the separation, a step of breaking the emulsion formed was additionally carried out by applying ultrasonic waves prior to the separation of an organic solution as needed.

Example 4-2: Surface Modification of MXene Using Aminated Hydrophobic Polymer Except for a case where an aminated hydrophobic polymer (polystyrene comprising —$NH_2$ at the end, MW=5,000) was used instead of an alkylamine, an organic solution, in which MXene particles surface-modified with an aminated hydrophobic polymer were dissolved, was separated by carrying out an interfacial reaction using the same method as in Example 4-1 above.

Example 5: Surface Modification of MXene Using Silane

Except for a case where dodecyltriethoxysilane was used instead of an alkyl phosphonic acid in hexanol, which is an organic solvent, by using the same method as in Example 1 above, an organic solution, in which MXene particles surface-modified with a dodecyltriethoxysilane were dissolved, was separated by carrying out an interfacial reaction.

Figure 3A:
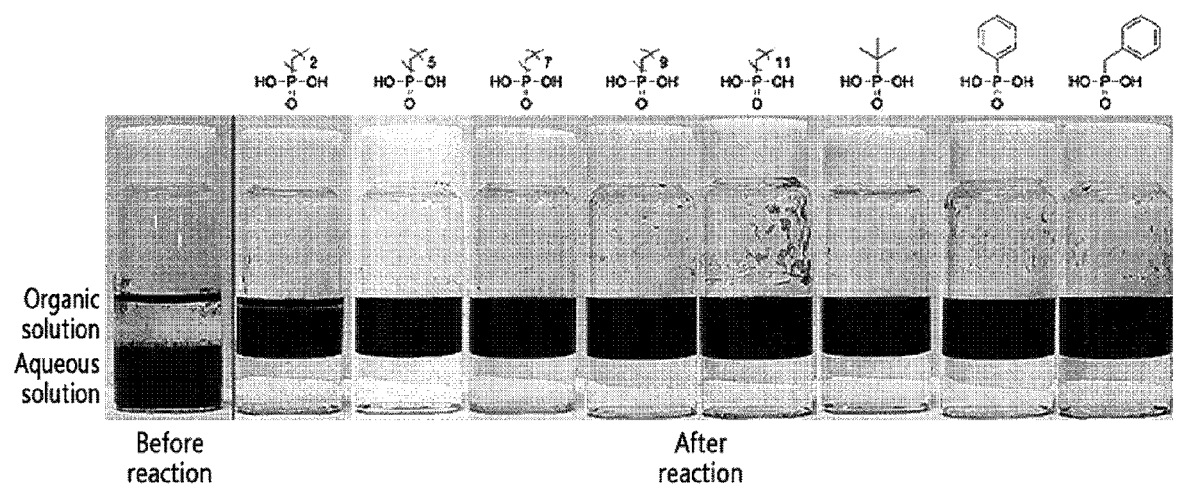
FIG. 3a shows the distribution of a MXene before and after surface modification reaction when using 1-hexanol as an organic solvent having a lower density than water in Examples 1 and 2.

Experimental Example 1-1: Distribution of MXene Before and After Surface Modification Reaction FIG. 3a shows the distribution of a MXene before and after a surface modification reaction when 1-hexanol, having a lower density than water, was used as an organic solvent in Examples 1 and 2. Before the interfacial reaction, $Ti_3C_2T_x$ MXenes were dispersed in an aqueous solution. However, through an interfacial reaction, surface-modified MXenes were shown to be moved to an organic solvent. Accordingly, after the interfacial reaction, all surface-modified MXenes moved to an organic solvent (1-hexanol) having low density and distributed in the upper layer. Thereafter, the aqueous solution was separated to obtain a surface-modified MXene ink dispersed in an organic solvent.

Figure 3B:
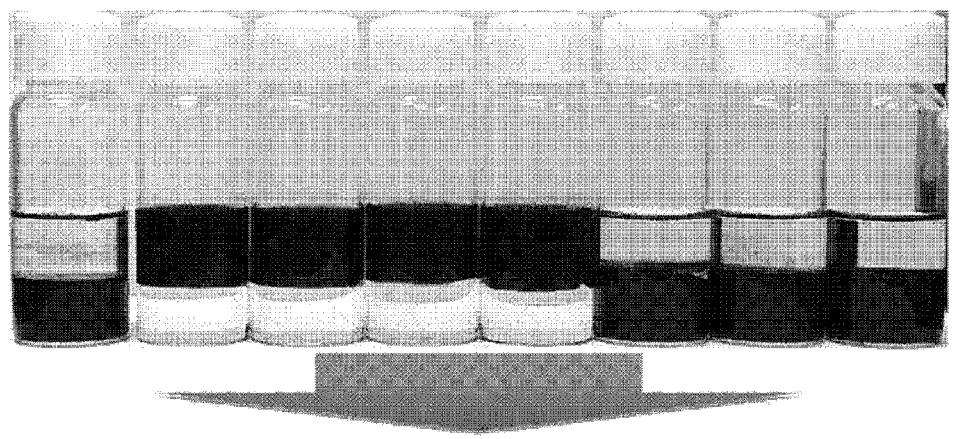
FIG. 3b shows the distribution of a MXene before and after surface modification reaction according to the kind of solvent, i.e., density, when using various organic solvents having a density higher or lower than water in Examples 4 and 5.
Figure 3B:
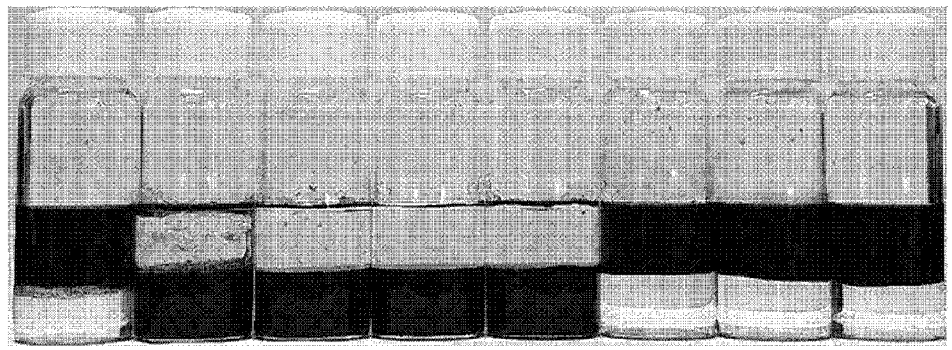

Experimental Example 1-2: Distribution of MXene Before and After Surface Modification Reaction FIG. 3b shows the distribution of a MXene before and after a surface modification reaction using various organic solvents in Examples 4-1 and 4-2. This shows that although MXenes were dispersed in an aqueous solution before the reaction, surface-modified MXenes moved to an organic solvent through an interfacial reaction. Accordingly, after the interfacial reaction, all surface-modified MXenes moved to an organic solvent (dichloromethane, chloroform, chlorobenzene, hexanol, benzene, toluene, and hexane). Specifically, when dichloromethane, chloroform, and chlorobenzene, having a higher density than water, were used as an organic solvent, MXenes were distributed in the bottom layer, and when hexanol, benzene, toluene, and hexane, having a lower density than water, were used as an organic solvent, MXenes were distributed in the upper layer. Thereafter, the aqueous solution layer was separated and removed to obtain a surface-modified MXene ink dispersed in an organic solvent.

Figure 3C:
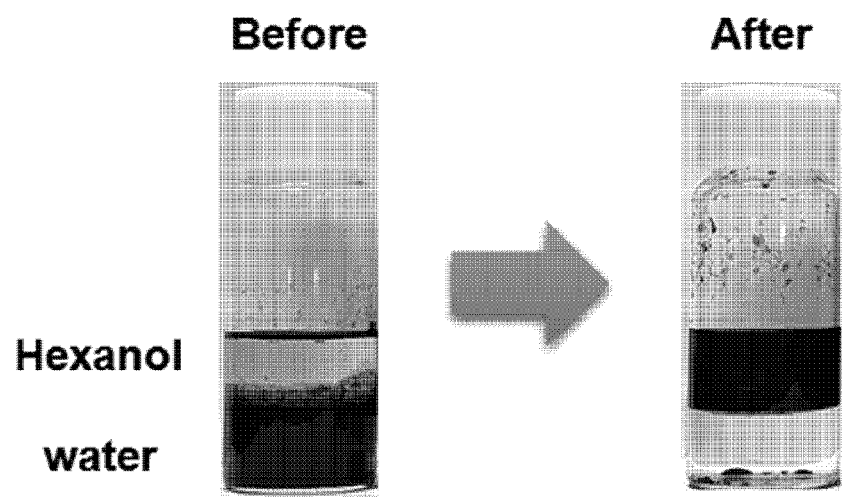
FIG. 3c shows the distribution of a MXene before and after surface modification reaction when using hexanol as an organic solvent having a lower density than water in Examples 5.

Experimental Example 1-3: Distribution of MXene Before and After Surface Modification Reaction FIG. 3c shows the distribution of a MXene before and after a surface modification reaction when hexanol, having a lower density than water, was used as an organic solvent in Examples 5. Before the interfacial reaction, $Ti_3C_2T_x$ MXenes were dispersed in an aqueous solution. However, through an interfacial reaction, surface-modified MXenes were shown to be moved to an organic solvent. Accordingly, after the interfacial reaction, all surface-modified MXenes moved to an organic solvent (hexanol) having low density and distributed in the upper layer. Thereafter, the aqueous solution was separated to obtain a surface-modified MXene ink dispersed in an organic solvent.

Example 6-1 to Example 6-8: MXene Dispersed in Various Organic Solvent

As an organic solvent, dichloroethane, dichloromethane, chloroform, anisole, chlorobenzene, benzene, toluene, and hexane were used, and for each organic solvent, propyl phosphonic acid, hexyl phosphonic acid, octyl phosphonic acid, decyl phosphonic acid, dodecyl phosphonic acid, tert-butyl phosphonic acid, phenyl phosphonic acid, benzyl phosphonic acid, diethyl 3-butenyl phosphonate, and diethyl (2-cyanoethyl) phosphonate were used as a phosphonic acid to separate an organic aqueous solution in which surface-modified MXene particles were dissolved using the same method as in Example 1 above.

Figure 4A:
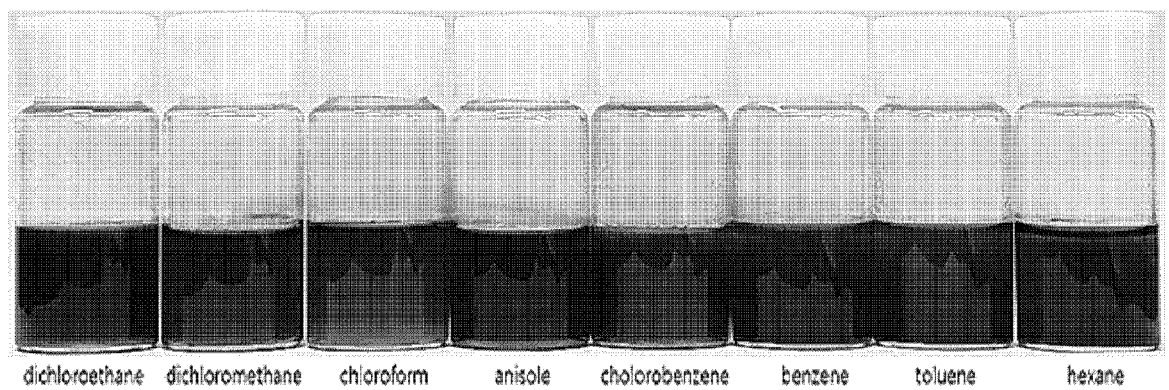
FIG. 4a shows inks in which a surface-modified MXene is dispersed in various organic solvents.

As a representative example among these, FIG. 4a shows an ink dispersed in an organic solvent of dichloroethane, dichloromethane, chloroform, anisole, chlorobenzene, benzene, toluene, and hexane by MXene particles surface-modified with dodecyl phosphonic acid.

FIG. 4a shows organic solutions in which surface-modified MXenes were separated by dispersing in various organic solvents. Accordingly, phosphonates comprising various alkyl groups, aryl groups, or functional groups can be used to obtain a MXene ink dispersed in various organic solvents having different polarity such as dichloroethane, dichloromethane, chloroform, toluene, etc.

Example 7-1 to Example 7-6: MXene Dispersed in Various Organic Solvents

Figure 4B:
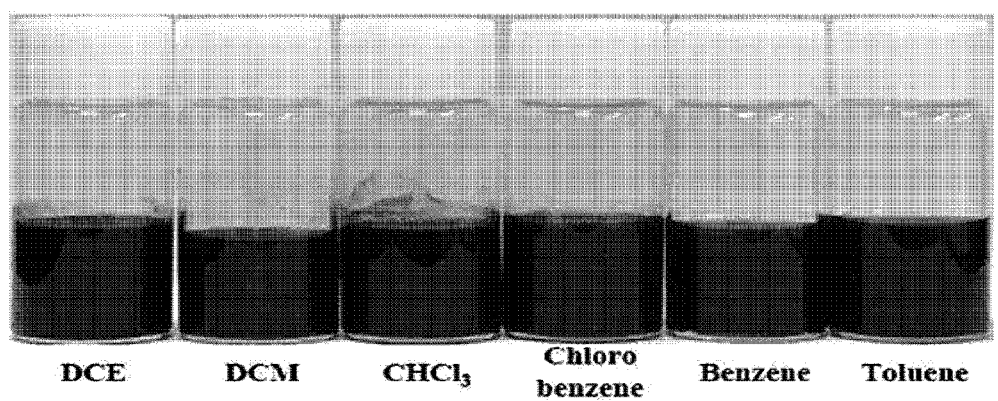
FIG. 4b shows inks in which a MXene surface-modified with aminated polystyrene (PS—NH$_2$) is dispersed in various organic solvents.

An ink was prepared by dispersing surface-modified MXene particles in an organic solvent, hexanol, dichloroethane (DCE), dichloromethane (DCM), chloroform ($CHCl_3$), chlorobenzene, benzene, and toluene with an alkylamine or an aminated hydrophobic polymer prepared according to Example 4 or 5 above, and the same is shown in FIG. 4b.

Figure 5A:
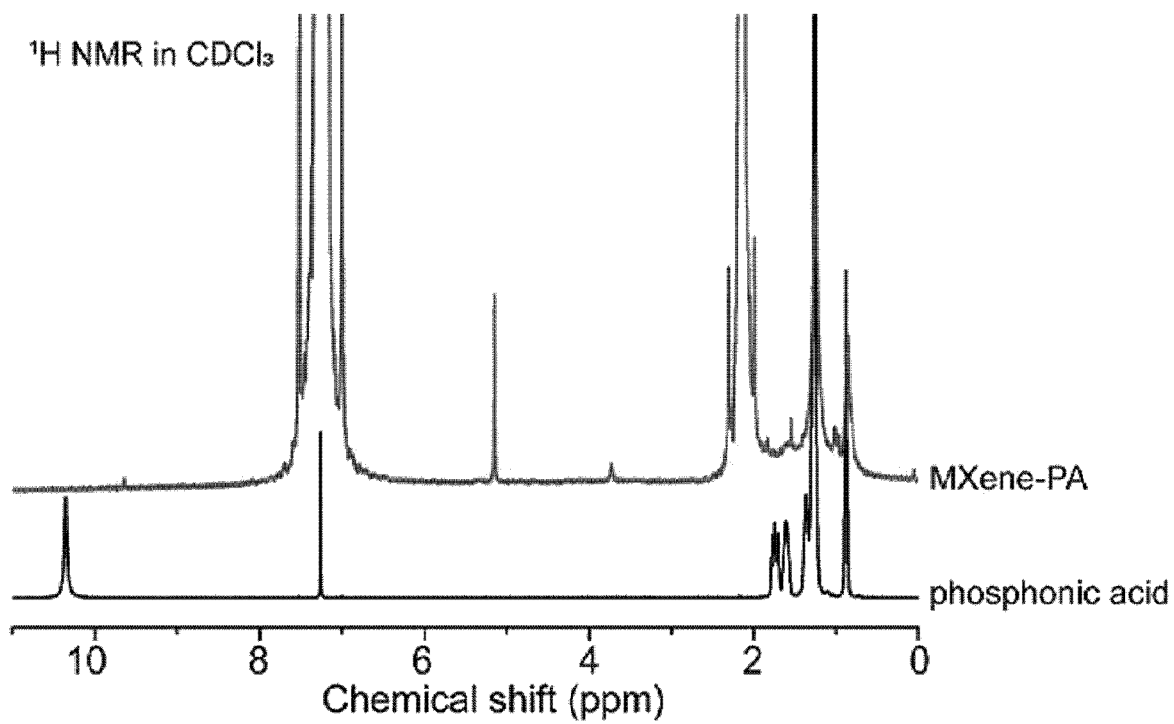
FIG. 5a shows the results of analyzing the composition of the surface-modified MXene using $^1$H NMR with respect to the surface-modified MXene particle in Example 1-5 in which a MXene of Ti$_3$C$_2$T$_x$ composition as a subject of surface modification was used and a MXene was modified with dodecyl phosphonic acid. With respect to the surface-modified MXene particle in Example 1-5.

Experimental Example 2-1: NMR Analysis of Composition of MXene Surface-Modified With Phosphonate As a subject of surface modification, a MXene of $Ti_3C_2T_x$ composition was used. With regard to the MXene particles surface-modified with dodecyl phosphonic acid in Example 1-5, as a result of analyzing the composition of a surface-modified MXene using $^1H$ NMR, a peak was observed near 0.8 ppm to 2.2 ppm, corresponding to an alkyl group of a phosphonic acid (FIG. 5a). Additionally, as the —OH peak (10.2 ppm) of a phosphonic acid disappeared after the reaction, it is considered that a Ti—O—P bond was formed.

Figure 5B:
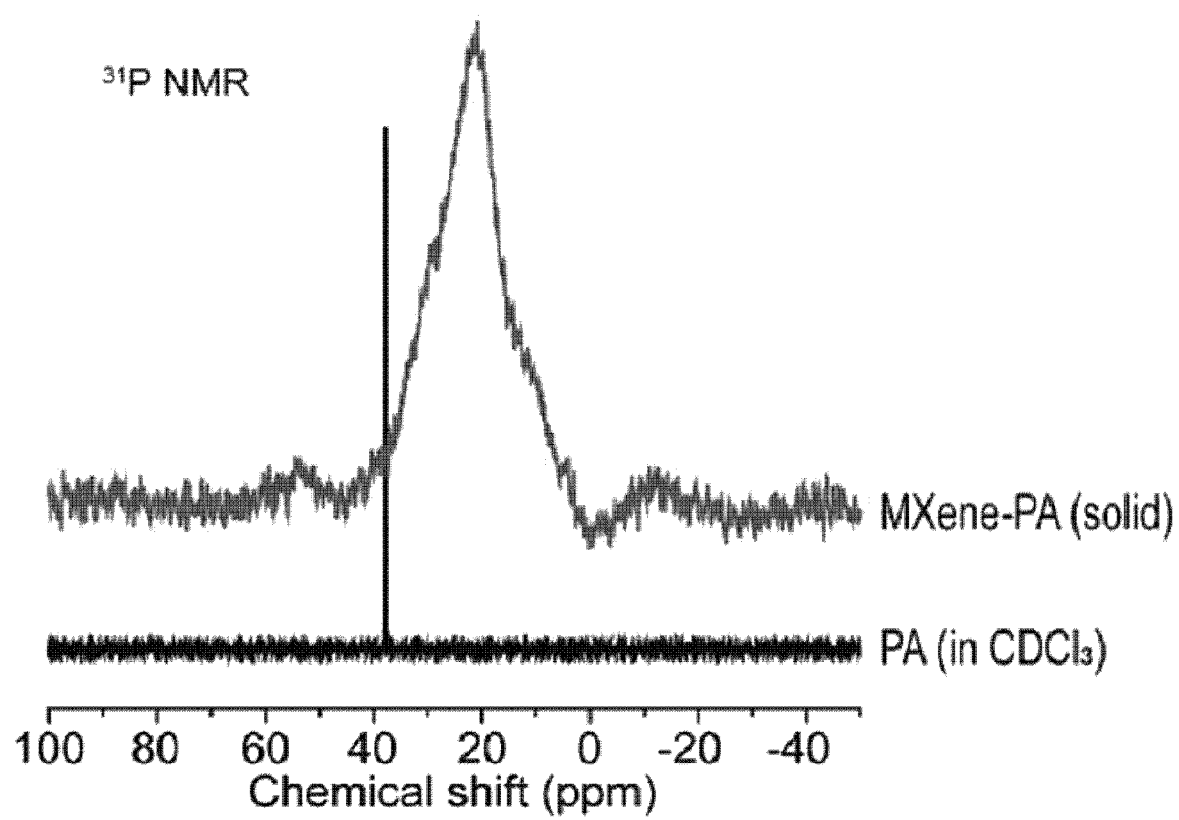
FIG. 5b shows the results of analyzing the composition of the surface-modified MXene using $^{31}$P NMR. With respect to the surface-modified MXene particle in which a MXene of Ti$_3$C$_2$T$_x$ composition as a subject of surface modification was used and MXene was modified with oleylamine.

With regard to the surface-modified MXene particles in Example 1-5, as a result of analyzing the composition of a surface-modified MXene using $^{31}P$ NMR, it was confirmed that a peak (38 ppm) resulting from a phosphonic acid was shifted to 25 ppm (FIG. 5b). The results show that a Ti—O—P bond was formed (Reference: Langmuir 2005, 31, 10966).

Figure 5C:
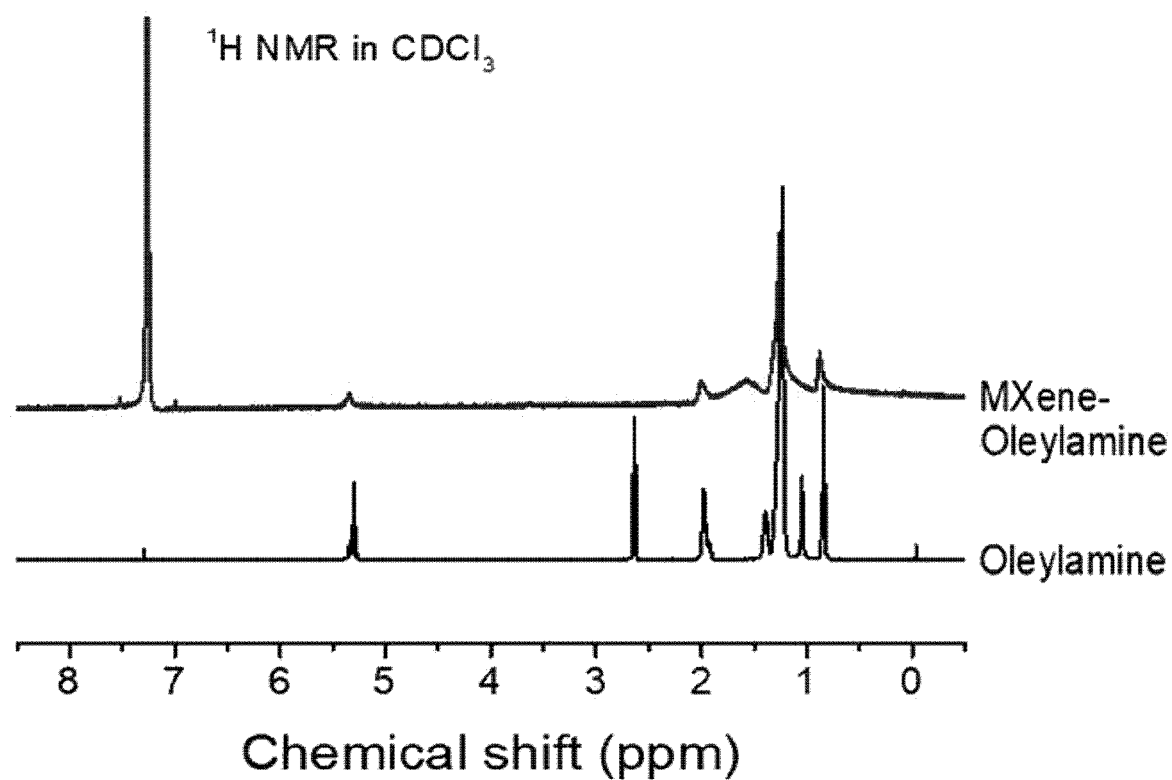
FIG. 5c shows the results of analyzing the composition of the surface-modified MXene using $^1$H NMR.

Experimental Example 2-2: NMR Analysis of Composition of MXene Surface-Modified With Amine Comprising Saturated or Unsaturated Hydrocarbon As a subject of surface modification, a MXene of $Ti_3C_2T_x$ composition was used. With regard to the MXene particles surface-modified with oleylamine, as a result of analyzing the composition using $^1H$ NMR, a peak was observed near 1.26 ppm to 5.35 ppm, corresponding to an alkyl group of an amine (FIG. 5c).

Figure 6A:
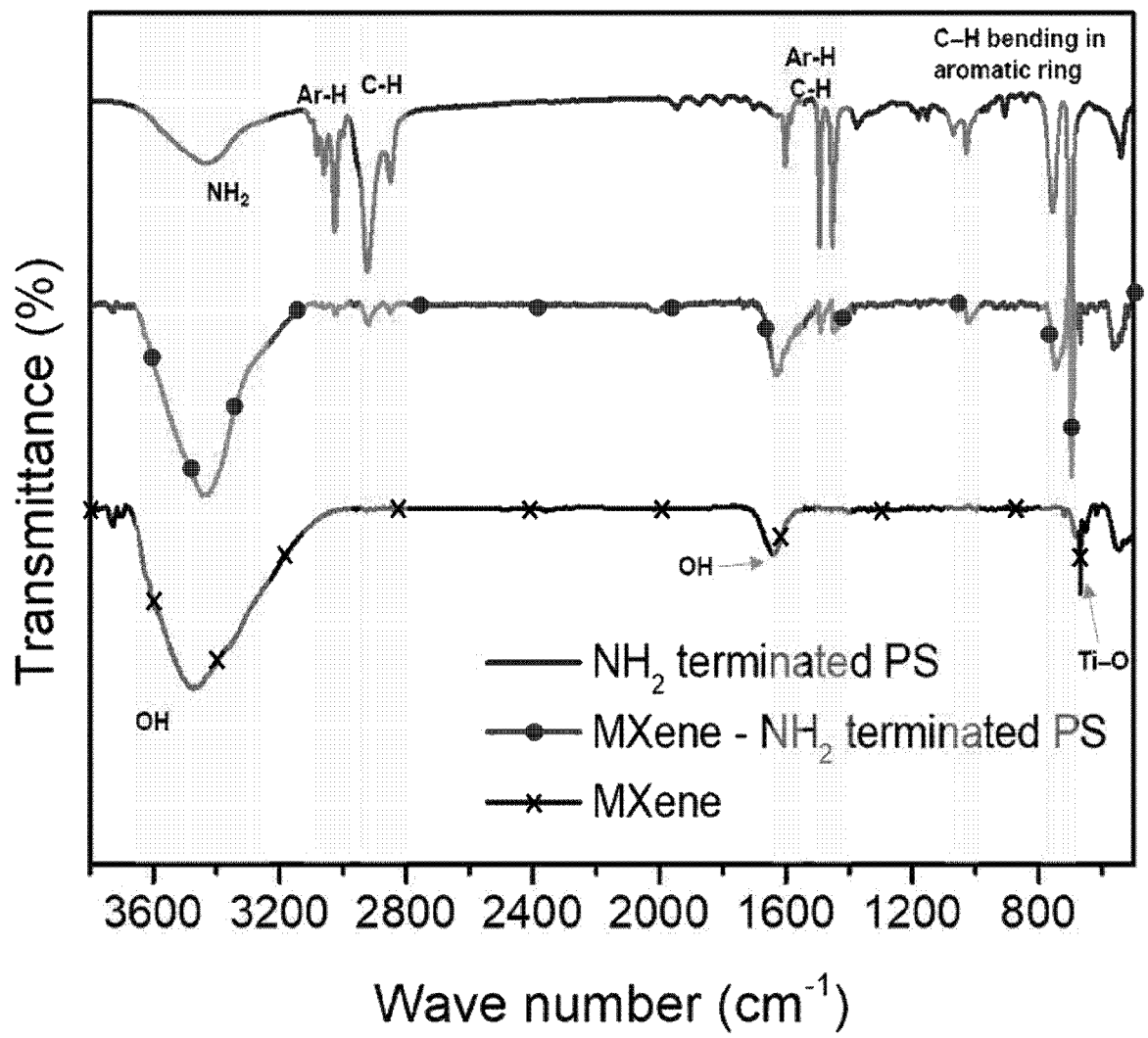
FIG. 6a shows the results of analyzing the composition of the surface-modified MXene using FT-IR.

Experimental Example 2-3: FT-IR Analysis of Composition of MXene Surface-Modified With Aminated Hydrophobic Polymer As a subject of surface modification, a MXene of $Ti_3C_2T_x$ composition was used. With regard to the MXene particles surface-modified with aminated polystyrene, as a result of analyzing the composition using FT-IR (FIG. 6a), peaks were observed near 2,800 $cm^{-1}$ to 3,000 $cm^{-1}$ and 1,400 $cm^{-1}$ to 1,600 $cm^{-1}$, corresponding to a hydrophobic polymer of an amine, i.e., C—H of polystyrene. In addition, peaks were observed near 3,000 $cm^{-1}$ to 3,150 $cm^{-1}$ and 700 $cm^{-1}$ to 1,100 $cm^{-1}$, which correspond to an aromatic ring.

Figure 6B:
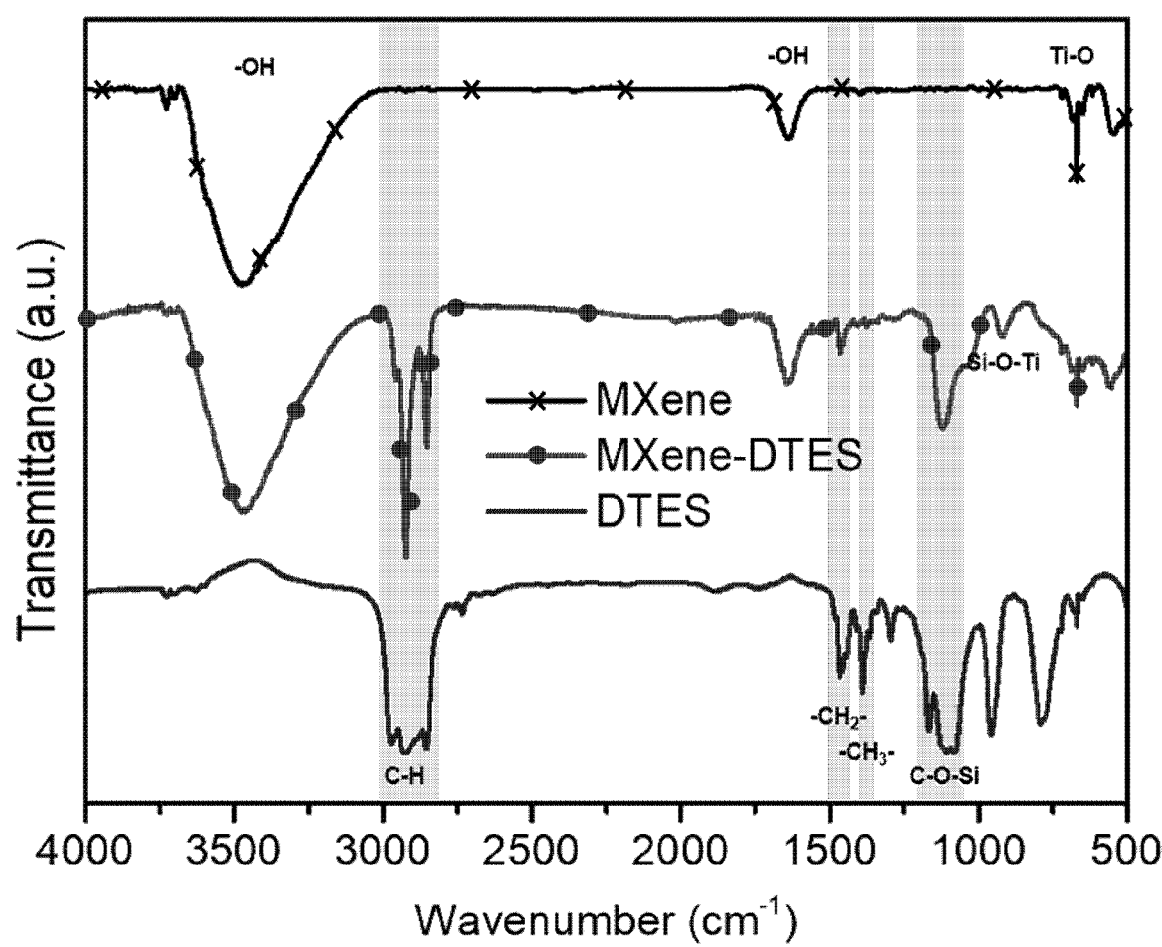
FIG. 6b shows the results of analyzing the composition of the surface-modified MXene with dodecyl-triethoxysilane(DTES) using FT-IR.

Experimental Example 2-4: FT-IR Analysis of Composition of MXene Surface-Modified With Silane As a subject of surface modification, a MXene of $Ti_3C_2T_x$ composition was used. With regard to the MXene particles surface-modified with dodecyltriethoxysilane, as a result of analyzing the composition using FT-IR (FIG. 6b), peaks not present in MXene were observed and vibration peaks were observed near 1000 $cm^{-1}$, corresponding to a T-O—Si bond. The results show that a covalent bond was formed on the MXene surface and the DTES.

Figure 7A:
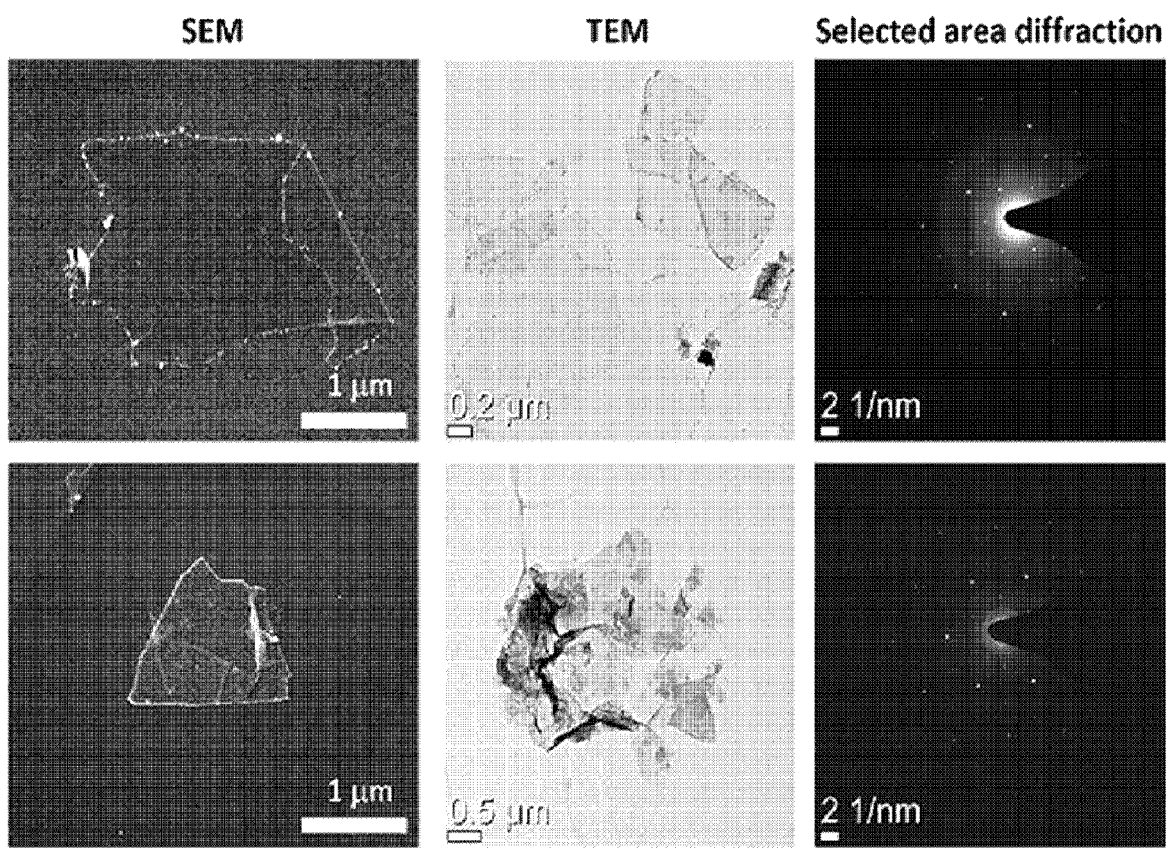
FIG. 7a shows the results of comparing the microstructure of a MXene (MXene of Ti$_3$C$_2$T$_x$ composition) before and after surface modification according to Examples 1-5 using a scanning electron microscope (SEM), a transmission electron microscope (TEM), and selected area electron diffraction (SAED).
Figure 7B:
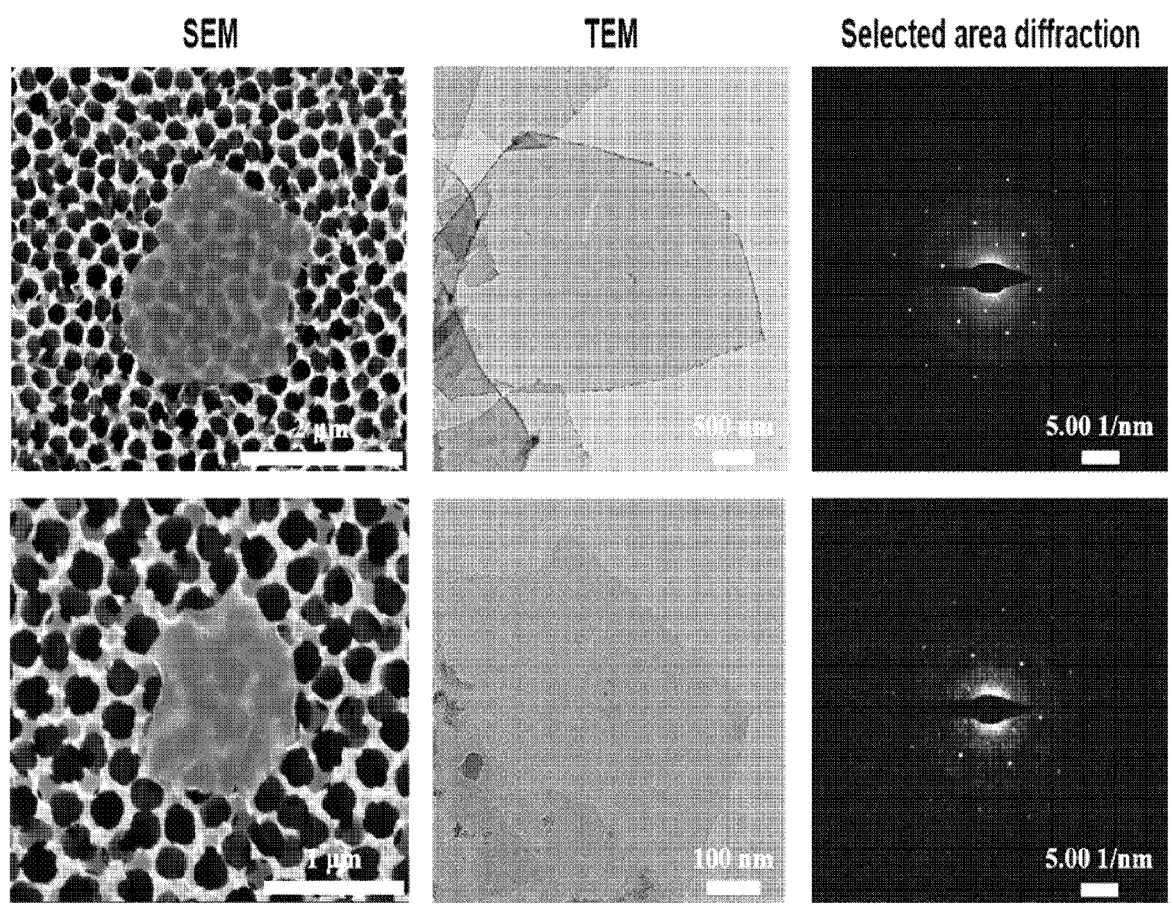
FIG. 7b shows the results of comparing the microstructure of a MXene (MXene of Ti$_3$C$_2$T$_x$ composition) before and after surface modification according to Example 4 using a scanning electron microscope (SEM), a transmission electron microscope (TEM), and selected area electron diffraction (SAED). (Top) before surface modification of MXene (Ti$_3$C$_2$T$_x$); (bottom) after surface modification of MXene.

Experimental Example 3: SEM and TEM Analysis of Microstructure of MXene Before and After Surface Modification The microstructure of a MXene (MXene of $Ti_3C_2T_x$ composition) before and after surface modification according to Example 1-5 and Example 4 was analyzed using a scanning electron microscope (SEM) and a transmission electron microscope (TEM). As can be seen in FIGS. 7a and 7b, it was confirmed that a 2D flake structure before modification was maintained intact after surface modification.

In particular, when a crystal structure was confirmed through an experiment of selected area electron diffraction (SAED), it was observed that the crystal structure of a MXene after surface modification was maintained intact as before modification (FIGS. 7a and 7b).

The results show that reactions between a phosphonic acid and a MXene and between an amine and a MXene occurred on the surface of particles. Accordingly, even if a 2-dimensional MXene particle is surface-modified with a functional group comprising a saturated or unsaturated hydrocarbon according to the present invention, it is considered that the inherent properties of the particle would be maintained intact.

Figure 8A:
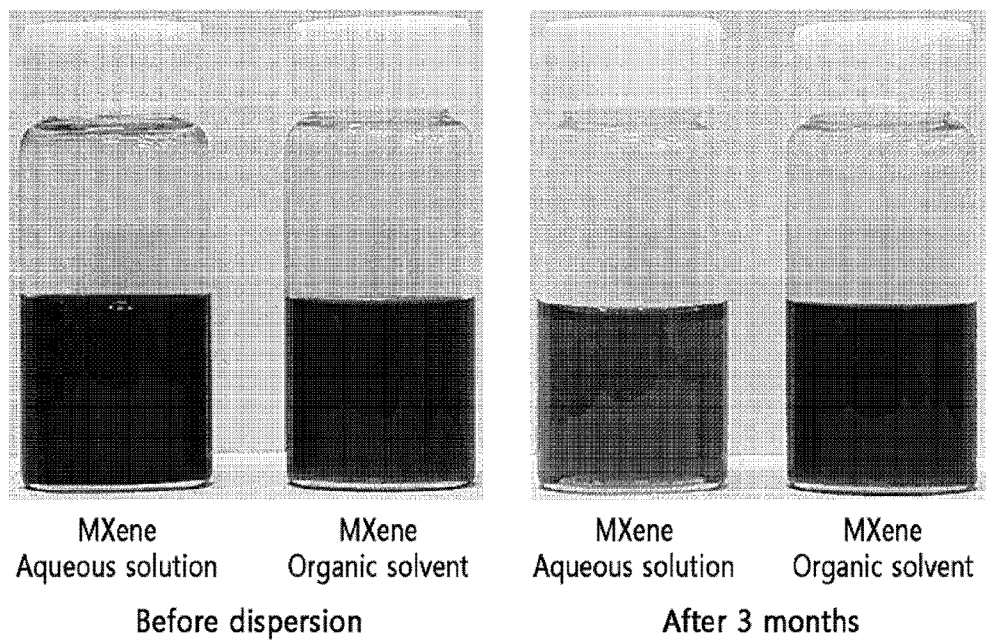
FIG. 8a shows a comparison of the appearances of a water-dispersed Ti$_3$C$_2$T$_x$ MXene and a MXene dispersed in chloroform (CHCl$_3$) after surface-modification with dodecyl phosphonic acid before and after 3 months' storage at room temperature.

Experimental Example 4: Comparison of Degree of Oxidization of Water-Dispersed/Organic-Dispersed MXenes The appearance of a water-dispersed $Ti_3C_2T_x$ MXene and a MXene, which was dispersed in chloroform ($CHCl_3$) after surface-modification with dodecyl phosphonic acid, after storage for 1 month or more at room temperature is shown in FIG. 8a.

It was observed that the water-dispersed $Ti_3C_2T_x$ MXene became cloudy as time passed. This indicates that the MXene was oxidized and turned into $TiO_x$ particles. Meanwhile, it was observed that a MXene, which was dispersed in chloroform, maintained its original color even after 6 months. This indicates that it is easy to store surface-modified MXenes for a long period of time by limiting their contact with water to prevent oxidization.

Figure 8B:
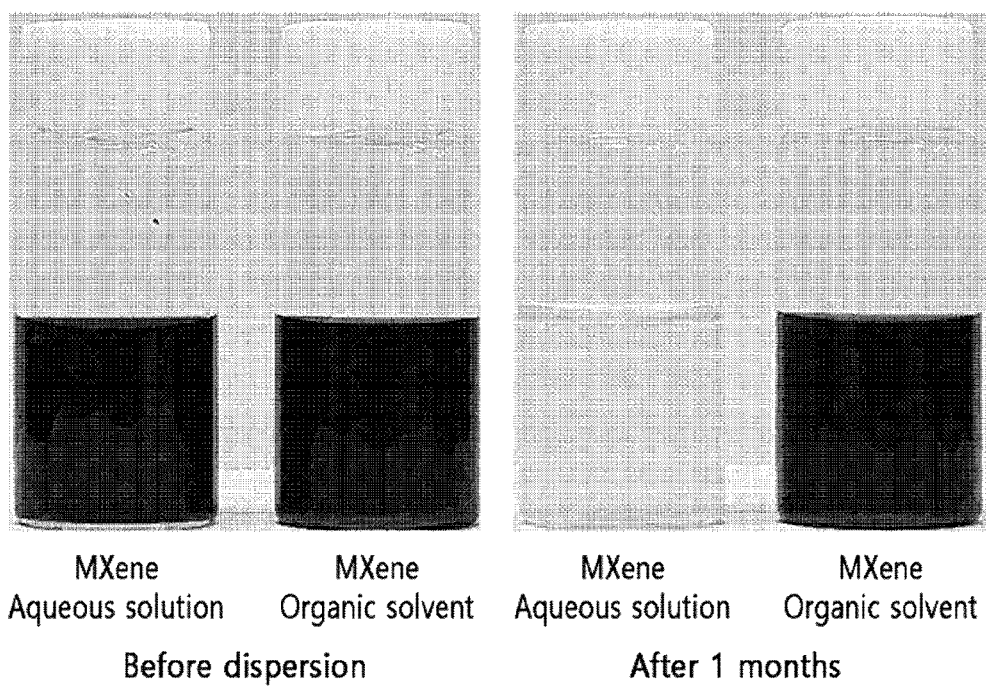
FIG. 8b shows a comparison of the appearances of a water-dispersed Ti$_3$C$_2$T$_x$ MXene and a MXene dispersed in toluene after surface-modification with aminated polystyrene before and after 3 months' storage at room temperature.

Experimental Example 5: Comparison of Degree of Oxidation of Water-Dispersed/Organic-Dispersed MXenes A photo was taken of the appearance of a water-dispersed $Ti_3C_2T_x$ MXene and a MXene which was prepared according to Example 5 and dispersed in toluene after surface-modification with aminated polystyrene for 3 months or more at room temperature, and shown in FIG. 8b.

It was observed that the water-dispersed $Ti_3C_2T_x$ MXene became cloudy as time passed, and this indicates that the MXene was oxidized and turned into $TiO_x$ particles. Meanwhile, it was observed that the MXene dispersed in an organic solvent, specifically, the MXene which was organically dispersed in toluene, maintained its original color over 6 months. This indicates that it is easy to store surface-modified MXenes for a long period of time by limiting their contact with water to prevent oxidization.

Experimental Example 6: Degree of Oxidation of Organic-Dispersed MXenes

Figure 8C:
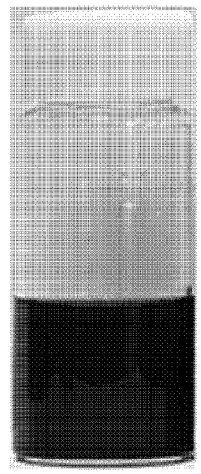
FIG. 8c shows the appearances of a MXene dispersed in hexanol after surface-modification with dodecyltriethoxysilane(DTES) after 1 months' storage at room temperature.

The appearances of a MXene dispersed in hexanol after surface-modification with dodecyltriethoxysilane(DTES), after 1 months' storage at room temperature is shown in FIG. 8c.

It was observed that a MXene, which was dispersed in hexanol, maintained its original color even after 1 months. This indicates that it is easy to store surface-modified MXenes for a long period of time by limiting their contact with water to prevent oxidization.

Figure 9A:
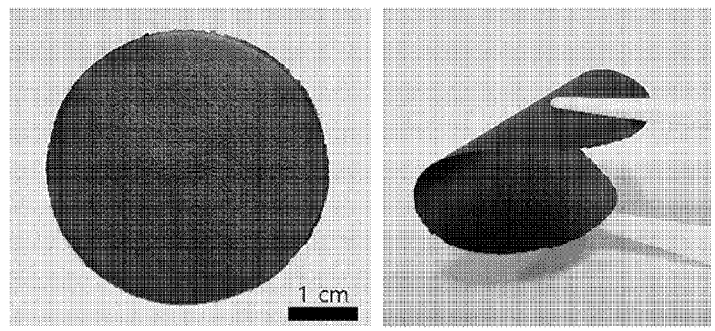
FIG. 9a shows a thin film prepared by a filtration method using a surface-modified MXene ink, which was dispersed in 1-hexanol according to Example 1-1 (surface-modified with dodecyl phosphonic acid), and a polypropylene membrane (pore size: 6 μm to 70 μm)

Example 8-1: Preparation of Thin Film Using MXene Ink Dispersed in Organic Solvent A thin film was prepared using a surface-modified MXene ink, which was dispersed in 1-hexanol according to Example 1-1 (surface-modified with propyl phosphonic acid), and a polypropylene membrane (pore size: 6 μm to 70 μm) with a filtration method. As shown in FIG. 9a, the prepared thin film had a thickness of 13.6 μm and showed flexibility.

Figure 10A:
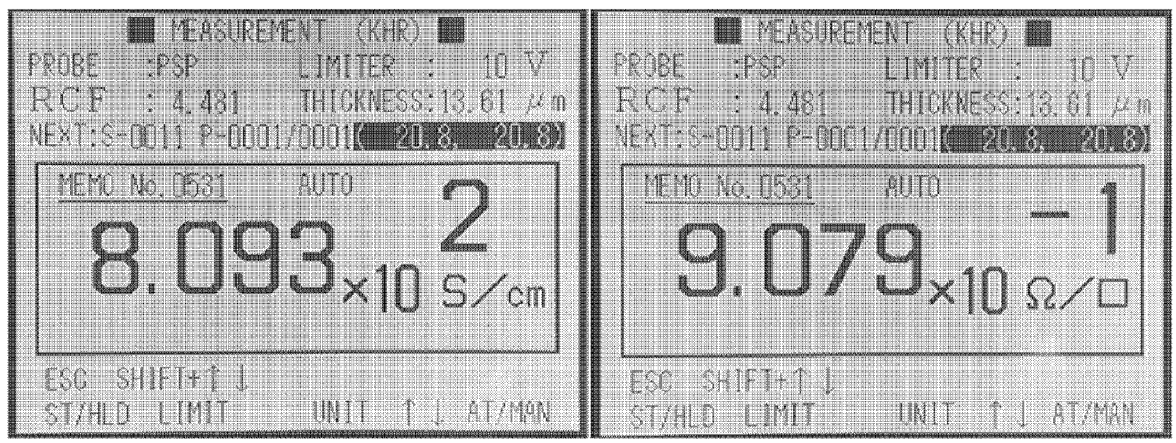
FIGS. 10a and 10b shows the conductivity and sheet resistance of each thin film prepared in FIGS. 9a and 9b.

As can be seen in FIG. 10a, the conductivity of the thin film prepared above was 800 S/cm or more, and the sheet resistance was 0.9 Ω/□.

Figure 9B:
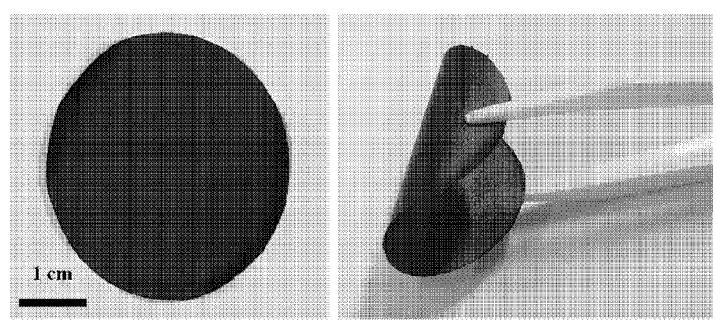
FIG. 9b shows a thin film prepared by a filtration method using a surface-modified MXene ink, which was dispersed in 1-hexanol by surface-modifying with hexylamine according to Example 1, and a polypropylene membrane (size: 6 μm to 70 μm).

Example 8-2: Preparation of Thin Film Using MXene Ink Dispersed in Organic Solvent A thin film was prepared using a surface-modified MXene ink, which was prepared by surface-modifying with hexylamine according to Example 4 and dispersing in hexanol according to Example 3, and a polypropylene membrane (pore size: 6 μm to 70 μm) with a filtration method. As shown in FIG. 9b, the prepared thin film had a thickness of 20.80 μm and showed flexibility.

Figure 10B:
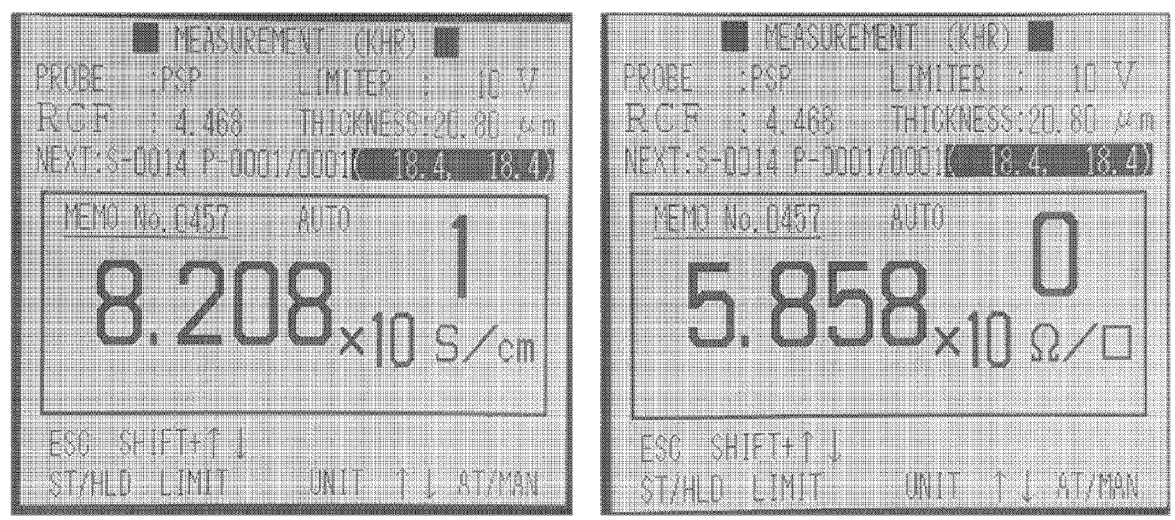

As can be confirmed in FIG. 10b, the conductivity of the thin film prepared above was 82 S/cm or more, and the sheet resistance was 5.9 Ω/□.

Figure 11:
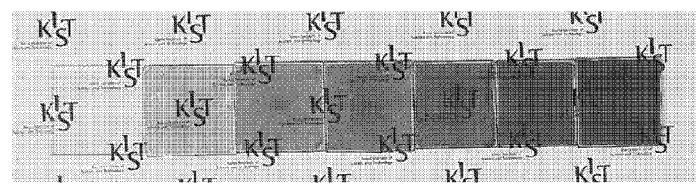
FIG. 11 shows a thin film prepared by spin-coating with a surface-modified MXene ink (concentration of 1 mg/mL) which was dispersed in 1-hexanol by surface-modifying with hexylamine prepared according to Example 5. It shows an image of depositing the coating layer with one layer at a time from the uncoated cover glass on the left side to the right side.

Example 8-3: Second Preparation of Thin Film Using MXene Ink Dispersed in Organic Solvent A thin film was prepared by spin-coating a MXene ink, which was prepared according to Example 7 and dispersed in hexanol by surface-modifying with hexylamine, and a MXene ink, which was prepared according to Example 7 and dispersed in toluene by surface-modifying with aminated polystyrene, on a cover glass. Representatively, a photo was taken of thin films which were prepared using a MXene ink dispersed in hexanol by surface-modifying with hexylamine, and is shown in FIG. 11.

Figure 12:
FIG. 12 shows a large-area patterned thin film formed by applying a MXene ink, which was dispersed in chloroform prepared according to the present invention, to spray-coating.

Example 8-4: Third Preparation of Thin Film Using MXene Ink Dispersed in Organic Solvent Except for a case using $CHCl_3$ instead of toluene as an organic solvent, large-area patterning was carried out by applying a MXene ink, which was prepared according to Example 7 and dispersed in chloroform by surface-modifying with oleylamine, to a substrate covered with a mask of a desired pattern with a spray-coating process, and the result thereof is shown in FIG. 12.

The invention claimed is:

1. A passivated 2-dimensional MXene particle, comprising:
   a 2-dimensional MXene particle surface-modified with a functional group comprising a saturated or unsaturated hydrocarbon; and
   an organic protective film formed on a surface of the surface-modified 2-dimensional MXene particle,
   wherein the functional group is selected from the group consisting of a phosphonate and a silane,
   wherein the phosphonate is represented by Formula 1 or 2, and the silane represented by Formula 4:

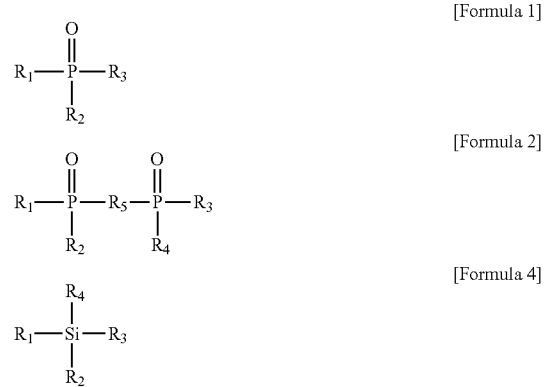

[Formula 1]

[Formula 2]

[Formula 4]

wherein $R_1$, $R_2$, $R_3$, and $R_4$ are independently a saturated or unsaturated hydrocarbon, a $C_1$ to $C_6$ alkoxy, or a hydroxyl group, and $R_5$ is a saturated or unsaturated hydrocarbon, with a proviso that each of $R_1$, $R_2$, $R_3$, and $R_4$ is not a saturated or unsaturated hydrocarbon or each of $R_1$, $R_2$, $R_3$, and $R_4$ is not a hydroxyl group,
wherein the surface-modified 2-dimensional MXene particle with a functional group comprising a saturated or unsaturated hydrocarbon is covered with an organic polymer, or dispersed in an organic polymer, forming the protective film.

2. The 2-dimensional MXene particle of claim 1, wherein the 2-dimensional MXene particle, as a subject of surface modification, is a 2-dimensional transition metal carbide, nitride, or combination thereof comprising at least one layer wherein a crystal cell having Empirical Formula 1 or 2 is formed in a 2-dimensional array:

$$M_{n+1}X_n \quad \text{[Empirical Formula 1]}$$

wherein, each X is located within an octahedral array,
M is a metal selected from the group consisting of Group IIIB metals, Group IVB metals, Group VB metals, and Group VIB metals,
each X is C, N, or a combination thereof, and
n is 1, 2, or 3; and $$M'_2M''_nX_{n+1} \quad \text{[Empirical formula 2]}$$

wherein, each X is located within an octahedral array of M' and M'',
M' and M'' are different metals selected from the group consisting of Group IIIB metals, Group IVB metals, Group VB metals, and Group VIB metals, each X is C, N, or a combination thereof, and n is 1 or 2.

3. The 2-dimensional MXene particle of claim 1, wherein the saturated or unsaturated hydrocarbon is independently selected from the group consisting of $C_{1-25}$ alkyl, $C_{2-25}$ alkenyl, $C_{2-25}$ alkynyl, $C_{6-25}$ aryl, and ($C_{6-25}$ aryl)-($C_{1-4}$ alkyl).

4. The 2-dimensional MXene particle of claim 1, wherein the amount of surface charge of the MXene particle is determined by adjusting the molecular weight, composition, and/or substituent of the saturated or unsaturated hydrocarbon in the surface-modified 2-dimensional MXene particle.

* * * * *